United States Patent
Lee et al.

(10) Patent No.: US 7,709,277 B2
(45) Date of Patent: May 4, 2010

(54) PAA-BASED ETCHANT, METHODS OF USING SAME, AND RESULTANT STRUCTURES

(75) Inventors: Hyo-san Lee, Suwon-si (KR); Hung-ho Ko, Seoul (KR); Chang-ki Hong, Seongnam-si (KR); Sang-jun Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 839 days.

(21) Appl. No.: 11/600,224

(22) Filed: Nov. 16, 2006

(65) Prior Publication Data

US 2007/0111532 A1    May 17, 2007

Related U.S. Application Data

(60) Division of application No. 10/976,161, filed on Oct. 29, 2004, now Pat. No. 7,178,041, which is a continuation-in-part of application No. 10/610,607, filed on Jul. 1, 2003, now Pat. No. 7,002,207, and a continuation-in-part of application No. 10/835,142, filed on Apr. 28, 2004.

(30) Foreign Application Priority Data

Aug. 13, 2003 (KR) .......... 10-2003-0057009
Apr. 8, 2004 (KR) .......... 10-2004-0024020

(51) Int. Cl.
*H01L 21/00* (2006.01)
*H01L 21/302* (2006.01)
*H01L 21/461* (2006.01)

(52) U.S. Cl. ............ 438/8; 438/692; 257/E21.228
(58) Field of Classification Search ............ 438/8, 438/752, 692; 257/E21.228, E21.304, E21.525
See application file for complete search history.

(56) References Cited

U.S. PATENT DOCUMENTS 4,996,574 A    2/1991    Shiraski (Continued)

FOREIGN PATENT DOCUMENTS

DE    195 27 131 A1    2/1996

(Continued)

OTHER PUBLICATIONS

T. K. Carns, et al., "Chemical Etching of $Si_{1-x}Ge_x$ in $HF:H_2O_2:CH_3COOH$", J. Electrochem. Soc., vol. 142, No. 4, Apr. 1995.

*Primary Examiner*—Walter L Lindsay, Jr.
(74) *Attorney, Agent, or Firm*—Harness, Dickey & Pierce, P.L.C.

(57) ABSTRACT

A wet-etch composition may include: peracetic acid (PAA); and a fluorinated acid; a relative amount of the PAA in the composition being sufficient to ensure an etch rate of (P-doped-SiGe):(P-doped-Si) that is substantially the same as an etch rate of (N-doped-SiGe):(N-doped-Si). Such a wet-etch composition is hereafter referred to as a PAA-based etchant and can be used to make, e.g., a CMOS MBCFET, an electrode of a capacitor, etc.

26 Claims, 27 Drawing Sheets

U.S. PATENT DOCUMENTS

| | | |
|---|---|---|
| 5,371,035 A | 12/1994 | Pfiester et al. |
| 5,559,049 A | 9/1996 | Cho |
| 5,583,362 A | 12/1996 | Maegawa |
| 5,782,984 A | 7/1998 | Lim et al. |
| 5,846,921 A | 12/1998 | Gil et al. |
| 5,972,124 A | 10/1999 | Sethuraman et al. |
| 6,100,203 A | 8/2000 | Kil et al. |
| 6,171,551 B1 | 1/2001 | Malchesky et al. |
| 6,302,766 B1 | 10/2001 | Sethuraman et al. |
| 6,326,667 B1 | 12/2001 | Sugiyama et al. |
| 6,413,802 B1 | 7/2002 | Hu et al. |
| 6,583,015 B2 | 6/2003 | Fitzgerald et al. |
| 6,635,921 B2 | 10/2003 | Yi et al. |
| 7,176,041 B2 * | 2/2007 | Lee et al. .......... 438/8 |
| 2002/0111024 A1 | 8/2002 | Small et al. |

FOREIGN PATENT DOCUMENTS

| | | |
|---|---|---|
| JP | 1985-124615 | 7/1985 |
| JP | 61-281873 | 12/1986 |
| JP | 1996-208633 | 8/1996 |
| JP | 1997-100452 | 4/1997 |
| JP | 2000-212776 | 8/2000 |
| JP | 2001-316691 | 11/2001 |
| JP | 2002-353443 | 12/2002 |
| JP | 2003-183652 | 7/2003 |
| KR | 1999-011951 | 2/1999 |
| KR | 10-0251649 | 1/2000 |
| WO | WO 00/79602 A1 | 12/2000 |
| WO | WO 02/47144 A2 | 6/2002 |

\* cited by examiner

Etch Via PAA-based Etchant To Obtain ...

Etch Via PAA-based Etchant To Obtain ...

PAA-BASED ETCHANT, METHODS OF USING SAME, AND RESULTANT STRUCTURES

This application is a divisional application of application Ser. No. 10/976,161, filed Oct. 29, 2004, now U.S. Pat. No. 7,178,041 now allowed, which is a continuation-in-part of two U.S. patent applications: one having Ser. No. 10/610,607, filed Jul. 1, 2003, now U.S. Pat. No. 7,002,207 for which priority is claimed under 35 U.S.C. §120, and the disclosure of which is incorporated herein in its entirety; and the other Ser. No. 10/835,142, filed Apr. 28, 2004 (itself claiming foreign priority upon Korean patent application No. P2003-0057009 filed Aug. 13, 2003), for which priority is claimed under 35 U.S.C. §120, and the disclosure of which is incorporated herein in its entirety.

BACKGROUND OF THE PRESENT INVENTION

The need to reduce transistor size is a perennial problem to be solved in the art of integrated circuits. One way that the Background Art reduced transistor size was to reduce the length of the channel. Doing so effectively reduced the overall footprint of the transistor. But then a minimum channel length (relative to other physical parameters of the transistor) was achieved below which problems were created, e.g., short channel effects.

The Background Art responded by developing a transistor architecture that reduced the transistor's footprint size while maintaining at least the minimum channel length. Whereas the larger footprint transistor architecture used a planar channel, the smaller footprint transistor architecture used a folded channel.

FIG. 9 is a three-quarter perspective view of the smaller footprint architecture according to the Background Art, which is generally referred to as a FinFET and particularly here as a triple-channel FinFET 900 having a body 902 (in which is formed the channel) in the shape of a fin (obscured in FIG. 9 but see 902b in FIG. 10) formed on a buried oxide (BOX) structure 901 between a source region 902a and a drain region 902C. Gate electrode 906 conforms (as does interposed gate oxide layer 904) to the shape of body 902.

FIG. 10 is a cross-sectional view of Background Art Fin-FET 900 taken along line X-X' of FIG. 9. Recall that the inversion layer induced in a channel is located in body 902 next to gate oxide 904 and tends to be rather shallow. An idealized effect of gate electrode 906 being adjacent to three sides of body 902 is as if three separate inversion layers are induced, namely a first inversion layer 908a, a second inversion layer 908b and a third inversion layer 908C. Hence, FinFET 900 can be referred to as a triple-channel FinFET.

Continuing efforts to reduce transistor size has led to the multi-bridge-channel FET (MBCFET). An MBCFET can be described as an FET having a stack of quadruple-channel bridges. FIGS. 1A and 1B are perspective views showing an active pattern and a gate electrode of an NMOS or PMOS MBCFET according to the Background Art.

Referring to FIG. 1A, an active pattern formed on a surface of an integrated circuit substrate such as a semiconductor substrate (not shown) includes a bridge-region 1 having plurality of bridges 4a, 4b and 4c formed in a vertical direction. Multiple channels can be induced in each bridge 4a, 4b and 4c of an operational MBCFET.

A plurality of tunnels 2a, 2b and 2c are formed between bridges 4a, 4b and 4c. Source/drain regions 3 are formed at the both sides of the bridge-region 1 (or, in other words, a central portion of the active pattern) so as to be connected to the plurality of bridges 4a, 4b and 4c (and the channels induced therein). Source/drain regions 3 are formed to have a width wider than that of bridges 4a, 4b and 4c. Between source/drain regions 3 and bridges 4a, 4b, 4c, there may be formed source/drain extension layers 5 connecting source/drain regions 4 to bridges 4a, 4b and 4c.

The plurality of tunnels 2a, 2b and 2c are formed between the bridges 4a, 4b and 4c. The lowest tunnel 2a is formed between the lowest bridge layer 4a and the underlying surface portion of the semiconductor substrate. A groove 2' corresponding in shape to tunnels 2a, 2b and 2c of a tunnel shape is formed on the uppermost bridge 4c.

Referring to FIG. 1B, a gate electrode 6 is formed on the active pattern. A gate-insulating layer 7 is formed between gate electrode 6 and the plurality of bridges 4a, 4b and 4c. Gate electrode 6 extends through and/or fills up the plurality of tunnels 2a, 2b and 2c and tunnel groove 2'. As such, gate electrode 6 is formed to surround the plurality of bridges 4a, 4b and 4c.

During operation, an MBCFET gate electrode 6 can induce four channels in each of bridges 4a, 4b and 4c. More particularly, an idealized effect of gate electrode 6 being adjacent to four sides of one of the brides 4a, 4b and 4c is as if four inversion layers (channels) are induced in the bridge. The four inversion layers are analogous to inversion layers 908a, 908b and 908c in FIG. 10.

Returning to FIG. 1A, before tunnels 2a, 2b and 2c are formed, the precursor to bridge-region 1 of the active pattern includes not only the plurality of bridge layers 4a, 4b and 4c (in which will be induced corresponding channels) but also a plurality of interbridge layers (which will become tunnels 2). The bridge and interbridge layers are stacked alternately with each other. Bridges 4a, 4b and 4c can include a single crystalline semiconductor film, such as silicon (Si) film. The interbridge layers can include silicon-germanium (SiGe). To obtain the arrangement of bridges 4a, 4b and 4c and tunnels 2a, 2b and 2c in FIG. 1A, the precursor to bridge-region 1 of the active pattern is etched with an etchant that is selective to SiGe over Si. In other words, such an etchant is used to form tunnels 2a, 2b and 2c.

SUMMARY OF THE PRESENT INVENTION

At least one embodiment of the present invention provides a wet-etch composition. Such a wet-etch composition (hereafter, PAA-based etchant) may include: peracetic acid (PAA); and a fluorinated acid; a relative amount of the PAA in the composition being sufficient to ensure an etch rate of (P-doped-SiGe):(P-doped-Si) that is substantially the same as an etch rate of (N-doped-SiGe):(N-doped-Si). Such a wet-etch composition is hereafter referred to as a PAA-based etchant.

At least one other embodiment of the present invention provides a method of using a PAA-based etchant in general.

At least one other embodiment of the present invention provides a method of using a PAA-based etchant to form a CMOS MBCFET (again, a multi-bridge channel FET).

At least one other embodiment of the present invention provides a method of using a PAA-based etchant to form an electrode of a capacitor.

Additional features and advantages of the invention will be more fully apparent from the following detailed description of example embodiments, the accompanying drawings and the associated claims.

BRIEF DESCRIPTION OF THE DRAWINGS

The present application makes mention of FIGS. 1A-1B, 2A-2C, 3A-3R, 4A-4G, 5, 6A-6C, 7A-7L and 8-10, but they are not discussed in that order. Rather, they are discussed in the order 9-10, 1A-1B, 5, 6A-6C, 2A-2C, 3A-3R, 4A-4G, 7A-7L and 8.

Excluding those labeled as Background Art, it should be noted that the accompanying Figures are intended to illustrate the general characteristics of methods and devices of example embodiments of the present invention, for the purpose of enhancing the description thereof. These drawings are not, however, to scale and may not precisely reflect the characteristics of any given embodiment, and should not be interpreted as defining or limiting the range of values or properties of example embodiments within the scope of this present invention.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer.

DETAILED DESCRIPTION OF EXAMPLE EMBODIMENTS

This section of the present application makes mention of FIGS. 1A-1B, 2A-2C, 3A-3R, 4A-4G, 5, 6A-6C, 7A-7L and 8, but they are not discussed in that order. Rather, they are discussed in the order 1A, 5, 6A-6C, 1B, 2A-2C, 3A-3R, 4A-4G, 7A-7L and 8.

In developing the present invention, the following problems with the Background Art were recognized and a path to a solution identified.

Figure 1A:
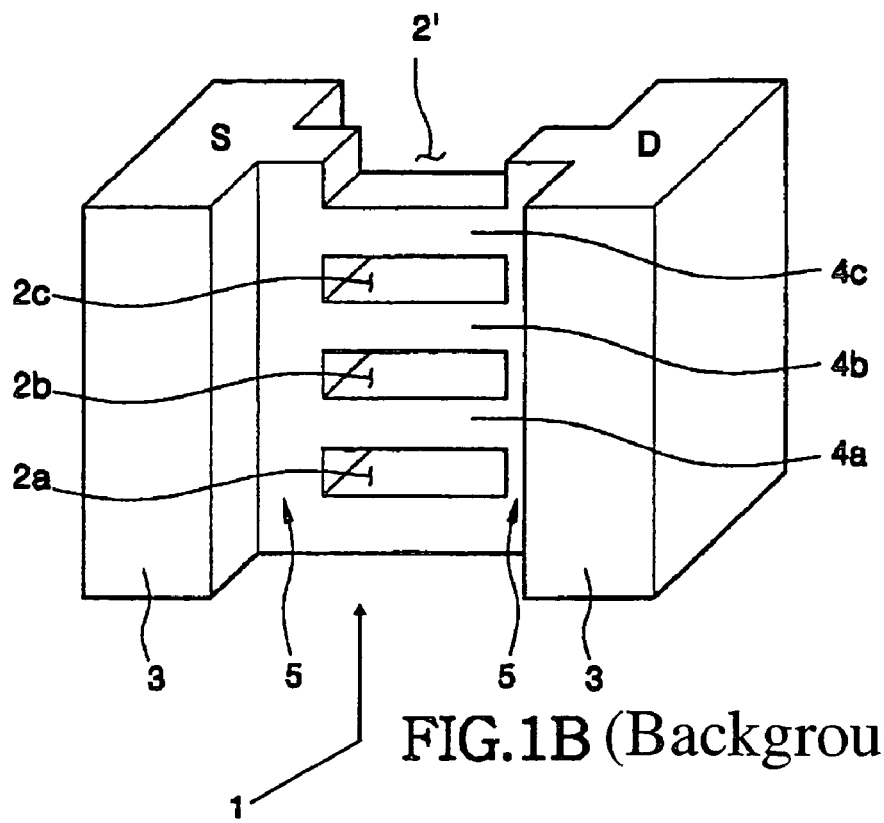
FIGS. 1A and 1B are perspective views showing an active pattern and a gate electrode of an NMOS or PMOS MBCFET according to the Background Art.

As noted, to obtain the arrangement of bridges 4a, 4b and 4c and tunnels 2a, 2b and 2c in Background Art FIG. 1A, the precursor to bridge-region 1 of the active pattern is etched with an etchant that is selective to SiGe over Si. The Background Art used one of four different etchant compositions: a first mixture of hydrofluoric acid (HF), nitric acid ($HNO_3$) and water ($H_2O$); a second mixture of hydrofluoric acid (HF), hydrogen peroxide ($H_2O_2$) and water ($H_2O$); a third mixture of ammonium hydroxide ($NH_4OH$), $H_2O_2$ and $H_2O$; a fourth mixture of HF, $HNO_3$, acetic acid ($CH_3COOH$) and deionized $H_2O$ (DI-$H_2O$); or a fifth mixture of HF, $H_2O_2$ and $CH_3COOH$. The first through third mixtures exhibit varying selectivity ratios (that vary with time and/or temperature, respectively), all of which are less than 20:1. This can be a problem because the length of time needed to etch the SiGe can be sufficient to produce unwanted etching of the Si, which can cause the transistor devices to malfunction.

The fourth and fifth mixtures can exhibit a selectivity ratio greater than 20:1, but only for NMOS transistors in which the bridge layers (Si) and interbridge layers (SiGe) are doped with boron. This is satisfactory for an NMOS MBCFET device. But where the MBCFET device is CMOS-type, the fourth mixture exhibits disparate selectivity. It should be recalled that a CMOS MBCFET device has not only NMOS transistors, but also PMOS transistors. And the PMOS transistors have Si bridge layers and SiGe interbridge layers (the latter ultimately being removed to form tunnels), e.g., doped with the opposite conductivity-type (e.g., phosphorous) as that of the source/drains (P-type), but which is the same dopant (if doped) as the substrate of the PMOS transistor. For a CMOS MBCFET device, the fourth mixture shows a satisfactory selectivity ratio of greater than about 20:1 for the NMOS transistors, but significantly poorer selectivity for the PMOS transistors of less than about 5:1. For example, where the precursor to bridge-region 1 is exposed at room temperature for about 10 minutes to the fifth mixture, the selectivity of boron-doped SiGe interbridge layers to Si bridge layers in the inchoate NMOS transistors was about 3,700 Å (angstroms), whereas the selectivity of phosphorous-doped SiGe interbridge layers to Si bridge layers in the inchoate PMOS transistors was about 2,100 Å, or for every angstrom that a PMOS transistor is etched, an NMOS transistor is etched about 1.7 Å.

Figure 5:
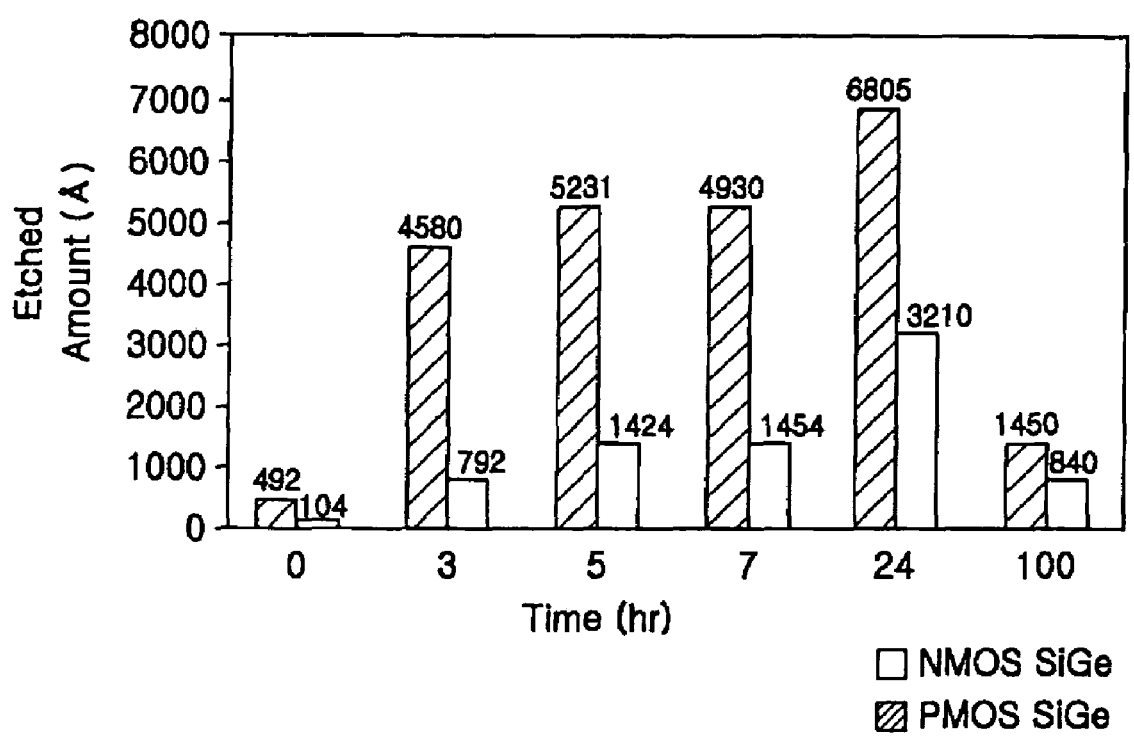
FIG. 5 is a histogram depicting amounts of NMOS SiGe and PMOS SiGe etched over various elapsed times.

FIG. 5 is a histogram depicting amounts of NMOS SiGe and PMOS SiGe etched over various elapsed times. Inspection of FIG. 5 reveals that the effectiveness of the fifth mixture approximates a bell curve.

The disparity in the degrees to which the NMOS and PMOS transistors are etched is a problem. Moreover, this is not a problem that is solved well merely by exposing the inchoate CMOS device to the etchant for longer than the minimum time needed for the inchoate NMOS transistors in order to sufficiently etch the inchoate PMOS transistors. This is because the extra etching time can undesirably result in unwanted etching of the Si bridge layers, which can cause the transistors to malfunction.

Without being bound by theory, it is believed that a mechanism to explain the etch selectivity of SiGe over Si was determined while developing the present invention. FIGS. 6B and 6C are simplified chemical equations that, without being bound by theory, are believed to correspond to the mechanism of FIG. 6A.

Figure 6A:
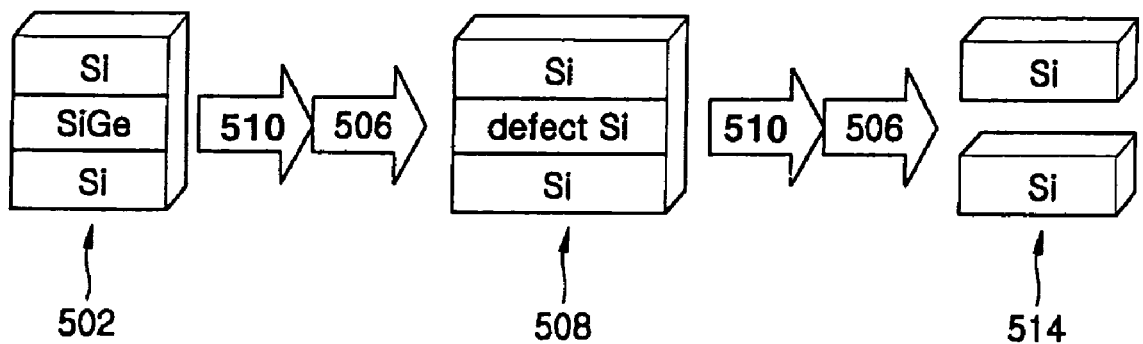
FIG. 6A is a diagram of that mechanism.
Figure 6B:
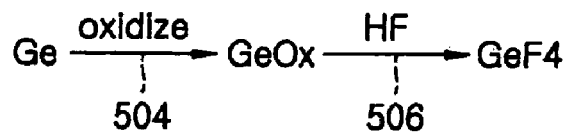
FIGS. 6B and 6C are simplified chemical equations that, without being bound by theory, are believed to correspond to the mechanism of FIG. 6A.
Figure 6C:
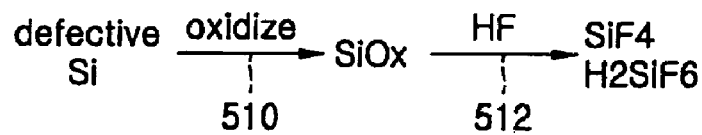

In FIG. 6A, a sandwich structure 502 is depicted as the starting point in the mechanism. Block 502 includes a layer of SiGe sandwiched between layers of Si, and is a simplified representation of the precursor to bridge-region 1 (prior to the etching thereof). As indicated by arrow 504, application of the etchant to block 502 initially oxidizes the Ge atoms in the SiGe compound to produce $GeO_x$. As indicated by arrow 506, the $GeO_x$ is then attacked by the HF component of the etchant to form germanium fluoride ($GeF_4$) as a byproduct, which leaves a substantially Ge-depleted sandwich structure 508. In contrast to the SiGe layer of sandwich structure 502, sandwich structure 508 instead has a defective layer of Si that is substantially, if not completely, devoid of Ge and whose crystal lattice is defective.

Next, as indicated by arrow 510, the defective Si layer is oxidized to produce $SiO_x$. As indicated by arrow 512, the SiOx is then attacked by the HF component of the etchant to form silicon fluoride ($SiF_4$) and di-hydrogen-silicon-flouride ($H_2SiF_6$) as byproducts. The result of arrow 512 is a sandwich structure 514 in which the defective Si layer has been substantially, if not completely, removed. Keeping in mind that the defective Si layer was a remnant of the SiGe layer, the result of the mechanism of FIG. 6A is that the SiGe layer of sandwich structure 502 is substantially (if not completely) removed as represented by sandwich structure 514.

Also while developing the present invention, the following was recognized: peracetic acid (PAA) is produced as a byproduct during etching of the precursor to bridge-region 1 where the fifth mixture is used as the etchant; and, coincidentally, the concentration of the PAA byproduct during such etching also approximates a bell curve.

Accordingly, while developing the present invention and without being bound by theory, it is believed to have been determined that the selectivity ratio of SiGe:Si during etching depends upon a capacity of the etchant to oxidize the defective Si layer of sandwich structure 508 without also oxidizing the adjacent Si layers. In other words, a suitable oxidant component would substantially oxidize the defective Si layer but would substantially avoid oxidizing the adjacent non-defective Si layers. Without being bound by theory, it is believed that a simplified chemical equation for the type of oxidation to be avoided is as follows.

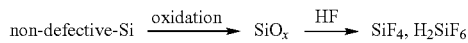

The following table (Table 1) lists oxidation capacities of various oxidizing compounds (or, in other words, oxidants) in units of electron volts (eV).

TABLE 1

| Oxidizer | eV* |
|---|---|
| Ozone | 2.07 |
| Peracetic Acid (PAA) | 1.81 |
| Chlorine Dioxide | 1.57 |

TABLE 1-continued

| Oxidizer | eV* |
|---|---|
| Sodium Hypochlorite | 1.36 |
| Hydrogen Peroxide | 1.33 (pH 7) |

*electron volts

Inspection of Table 1 reveals that PAA has the second to highest oxidation capacity, behind ozone. While developing the present invention and without being bound by theory, it is believed to have been further determined that SiGe:Si selectivity is a manifestation of the differences in matrix integrity between the non-defective-Si layers and the defective-Si layer in sandwich structure 508. More particularly, a suitable etchant is one that has a relatively large oxidation capacity, but not so large that the differences in matrix integrities cannot produce a difference in etch rates of SiGe vs. Si. In other words, without being bound by theory, it is believed to have been determined that the oxidation capacity of ozone was sufficiently large such that the difference in matrix integrity of the defective-Si layer did not result in a significantly, much less substantially, higher etch rate compared to the etch rate of the non-defective-Si layers.

The oxidation capacity of PAA is not so large that (without being bound by theory) differences in matrix integrities produce a negligible etch-rate difference. Rather, PAA yields the highest SiGe:Si ratio of the oxidants in Table 1. Other oxidants in Table 1, e.g., chlorine dioxide (Cl02), exhibit SiGe vs. Si etch-rate disparities, but their SiGe:Si selectivities are not as great as PAA. There may be other oxidants with sufficiently large, albeit not too large, oxidation capacity, the inclusion of which in an etchant can achieve satisfactory SiGe:Si selectivity ratios, e.g., of at least about 20:1.

According to at least one embodiment of the present invention, a wet-etch composition (or, in other words, an etchant) comprises: an oxidant exhibiting a significantly greater etching rate for SiGe relative to Si; and a fluorinated acid; a relative amount of the oxidant in the composition being sufficient to ensure an etch rate of (P-doped-SiGe):( P-doped-Si) that is substantially the same as an etch rate of (N-doped-SiGe):(N-doped-Si). An example of such an oxidant is PAA (again, peracetic acid). Hereafter, such an etchant will be referred to as a PAA-based-etchant.

In a PAA-based etchant, a relative amount of PAA is sufficient to ensure an etch rate of P-doped-SiGe:Si that is substantially the same as an etch rate of N-doped-SiGe:Si. The relative amount of PAA can be in a range of about 1.0 wt % to about 50 wt %, e.g., about 2.0 wt %. And the relative amount of PAA is sufficient to achieve a SiGe:Si selectivity ratio of at least about 20:1, and more particularly of at least about 60:1. The fluorinated acid can be selected from a group consisting of HF, $NH_4F$ and a mixture thereof.

The PAA-based etchant further can optionally include: a diluent; and/or an additional component selected from a group consisting of surfactants, buffering agents; secondary oxidizers and polymers. The diluent can include de-ionized water. The surfactant can be selected from a group consisting of cationic surfactants, anionic surfactants and non-ionic surfactants.

More particularly, the surfactant can be selected from a group consisting of cethyl trimethyl ammonium bromide (CTABr), ammonium lauryl sulfate (ALS), lauryl alcohol ethylene oxide, stearyl alcohol ethylene oxide, nonyl phenol ethylene oxide, tri-decyl alcohol ethylene oxide and oleyl alcohol ethylene oxide.

If the PAA-based etchant includes polymers, such a polymer can be selected from a group consisting of cationic polymers and anionic polymers. More particularly, the polymer can be selected from a group consisting of polyethylene imine, polylysine, polyacrylic acid, polyacrylamide, poly (methacrylic acid), poly(diethylaminoethyl methacrylate) and poly(dimethylaminoethyl methacrylate).

The secondary oxidizer can be selected from a group consisting of $H_2O_2$, $H_3PO_4$, $HNO_3$, $H_2SO_4$, $I_2$, $NH_4NO_3$, $(NH_4)_2SO_4$, $NH_4IO_3$, $HClO_4$, $HClO_2$, $O_3$ and $H_5IO_6$.

Also, the PAA-based etchant can optionally include at least one buffering agent selected from a group consisting of acetic acid, ammonium acetate, methanol, ethanol, propanol, isopropanol, butanol, pentanol, hexanol and heptanol.

For example, such a PAA-based etchant can have the following composition. peracetic acid constituting between about 0.05 and about 17.5 wt % of the etchant composition; fluorinated acid constituting between about 0.05 and about 15 wt % of the etchant composition; surfactants, if present, constituting up to about 10 wt % of the etchant composition; buffering agents, if present, constituting up to about 30 wt % of the etchant composition; secondary oxidizers, if present, constituting up to about 30 wt % of the etchant composition; polymers, if present, constituting up to about 5 wt % of the etchant composition; and, if present, deionized water as a diluent.

The following table (Table 2) summarizes the preceding discussion of a PAA-based etchant.

TABLE 2

| COMPONENT | FUNCTION | RATIO |
|---|---|---|
| PAA, about 5 wt % to about 35 wt % equilibrium solutions of peracetic acid | main SiGe etching-agent | about 1~about 50 wt % |
| aqueous HF typically about 49 wt % HF, semiconductor grade | SiGe etching-enhancer, but at excessive amounts can deteriorate SiGe:Si selectivity ratio | about 0.1~about 30 wt % |
| DI-water | diluting agent | about 10~about 50 wt % |
| buffer, e.g., acetic acid | buffer solution to improve etch uniformity | about 0.1~about 30 wt % |
| secondary oxidizer | SiGe etch agent to control fine (SiGe) etch | about 0.05~about 30 wt % |
| surfactant | buffer solution to minimize Si etch thereby complement etch uniformity | about 0.05~about 10 wt % |
| polymer | buffer solution to minimize oxide etch | about 0.01~about 5 wt % |

Instead of the component aqueous HF, a PAA-based etchant can alternatively include NH4F and/or an HF/NH4F mixture, where the alternative component constitutes between about 0.05 and about 17.5 wt % of the etchant composition. Instead of the component acetic acid, a PAA-based etchant can alternatively include ammonium acetate and/or an alcohol such as IPA Generalized examples of using such a PAA-based etchant are now provided.

As Example 1, consider a first wafer having a first layer of silicon dioxide (SiO2) formed to a thickness of, e.g., about 1420 Å (again, angstroms), and second layer of single crystal Si was formed to a thickness of, e.g., about 500 Å on the $SiO_2$ first layer. Also consider second, third and fourth wafers formed of epitaxially grown boron-doped SiGe (as can be found, e.g., in an NMOS MBCFET), phosphorous-doped SiGe (as can be found, e.g., in a PMOS MBCFET) and non-doped SiGe, respectively. Each of the first through fourth wafers was immersed at about 25° C. for about 5 minutes in about one liter of a PAA-based etchant having a composition C1 as follows: 49 wt % aqueous HF (a commercially-available formulation), 30 wt % PAA, 98 wt % acetic acid (a commercially-available formulation), and DI-$H_2O$ in a ratio of about 1.5:30:30:30. Then, the wafers were washed with DI-$H_2O$ and dried by purging with nitrogen gas. Afterward, the amounts of etched Si:Ge and Si were respectively measured via vertical scanning electron microscopy (V-SEM). The results are shown in the following table (Table 3).

TABLE 3

| (Example 1) | | |
|---|---|---|
| Etched materials | Etched amount | Selectivity to Si |
| Single crystal Si | 23.5 Å | |
| Boron-doped SiGe | 2,600 Å | 2,600/23.5 = 110 |
| Phosphorus-doped SiGe | 2,560 Å | 2,560/23.5 = 109 |
| Undoped SiGe | 2,700 Å | 2,700/23.5 = 115 |

As Example 2, consider the same four wafers as in Example 1. Each of the first through fourth wafers was immersed at about 25° C. for about 5 minutes in about one liter of a PAA-based etchant having a composition C2. Composition C2 includes composition C1, to which is added 0.1 vol % of a non-ionic surfactant (product NVW 1002 manufactured by Wako Pure Chemical Industries, Ltd. of Japan). Then, the wafers were washed with DI-H2O and dried by purging with nitrogen gas. Afterward, the amounts of etched Si:Ge and Si were respectively measured via V-SEM. The results are shown in the following table (Table 4).

TABLE 4

| (Example 2) | | |
|---|---|---|
| Etched materials | Etched amount | Selectivity to Si |
| Single crystal Si | 20.3 Å | |
| Boron-doped SiGe | 3,030 Å | 3,030/20.3 = 149 |
| Phosphorus-doped SiGe | 2,470 Å | 2,470/20.3 = 121 |
| Non-doped SiGe | 2,450 Å | 2,450/20.3 = 121 |

More particular uses of a PAA-based etchant will now be discussed. Such use can include the manufacture of a CMOS MBCFET device, and the manufacture of a storage node of a capacitor.

Figure 1B:
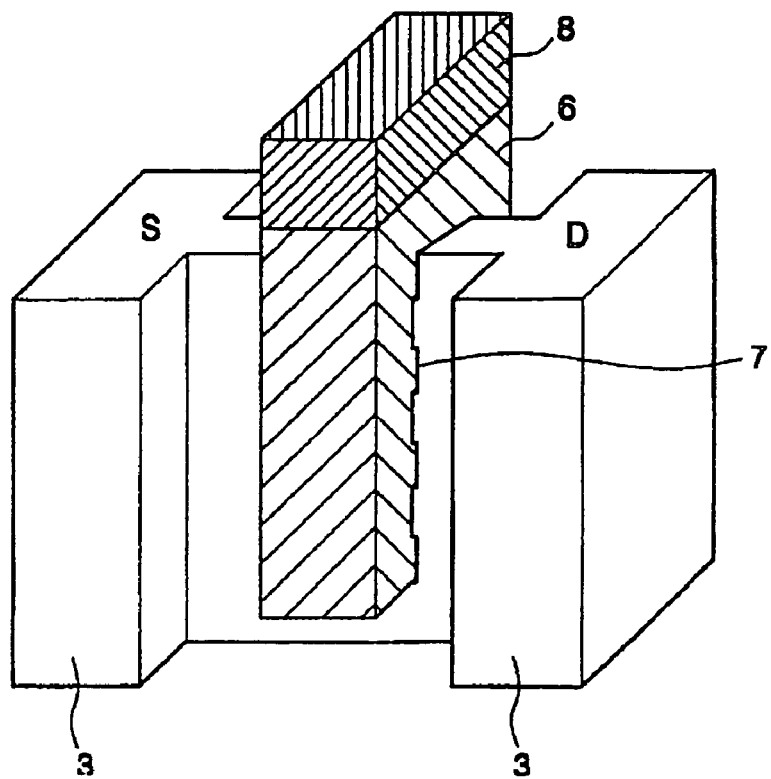
Figure 2A:
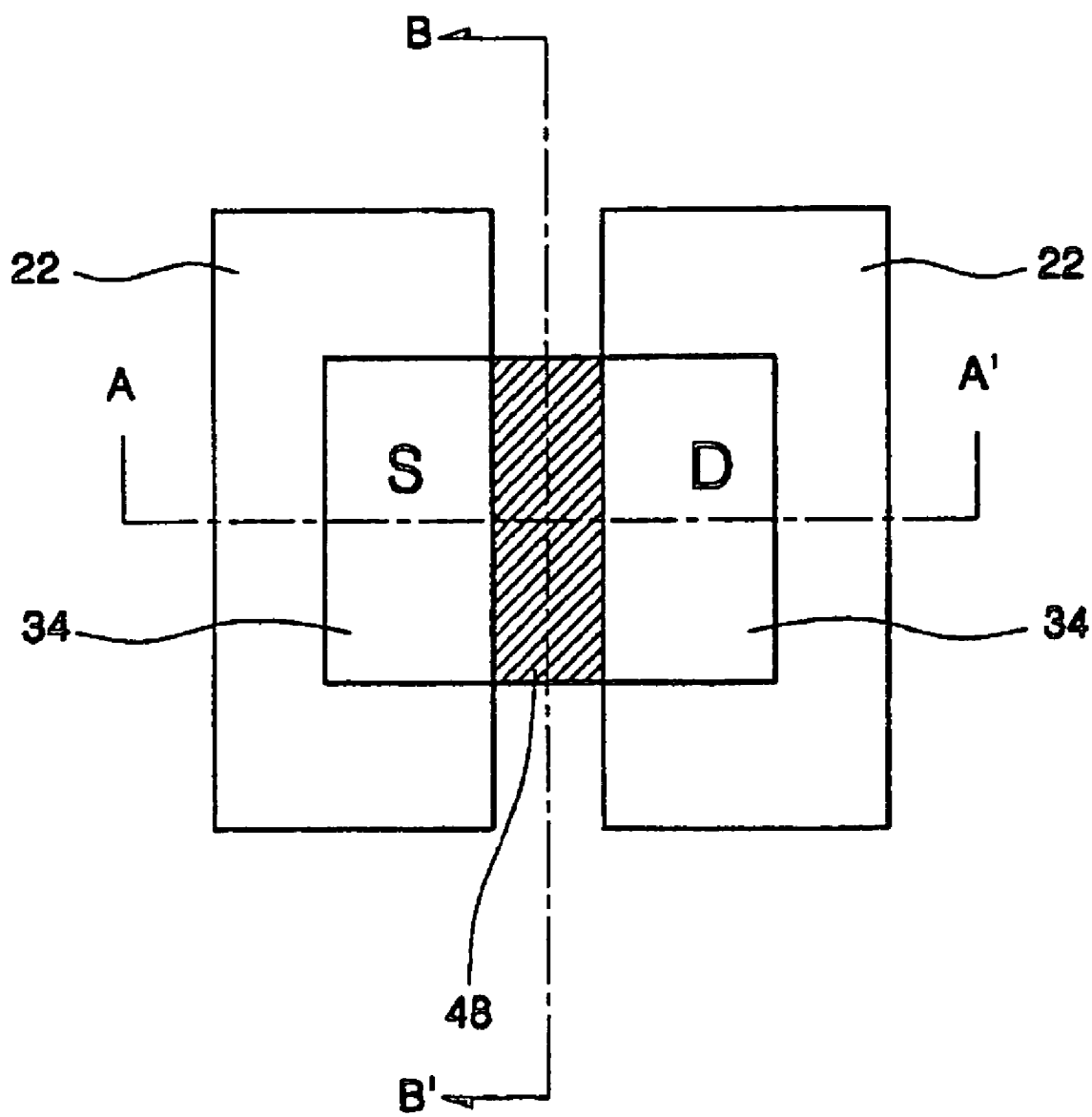
FIG. 2A is a plan view of a CMOS MBCFET device according to at least one embodiment of the present invention.

FIGS. 1A-1B of the Background Art depict either an NMOS or a PMOS MBCFET (again, multi-bridge channel FET). FIG. 2A is a plan view of a CMOS MBCFET device according to at least one embodiment of the present invention, and corresponding to the PMOS or NMOS MBCFET of FIGS. 1A-1B.

For the CMOS MBCFET, the semiconductor substrate comprises silicon (Si), silicon germanium (SiGe), silicon-on-insulator (SOI), silicon germanium-on-insulator (SGOI) and/or other conventional substrates. In some embodiments, the semiconductor substrate can comprise a single crystalline Si.

For the CMOS MBCFET, bridges 4a, 4b and 4c can comprise a single crystalline semiconductor film, such as silicon film. Source/drain regions 3 can comprise a selective epitaxial single crystalline film or a conductive film such as a polysilicon film, a metal film, a metal silicide film, etc. In case of using the selective epitaxial single crystalline film or the polysilicon film, an impurity is ion-implanted in the source/drain regions 3 so that the source/drain regions 3 are conductive.

For the CMOS MBCFET, in case of forming source/drain extension layers 5 between bridges 4a, 4b and 4c and source/drain regions 3 as shown in FIGS. 1A-1B, in some embodiments the source/drain regions 3 can comprise a conductive film such as a polysilicon film, a metal film, a metal silicide film, etc. and source/drain extension layer 3 can comprise a selective epitaxial single crystalline film.

For the CMOS MBCFET, gate electrode 6 can comprise a polysilicon film. Gate stack layer 8 may comprise a metal silicide for reducing a gate resistance and/or an insulating material for capping gate electrode 6. Gate-insulating layer 7 can comprise a thermal oxide film or an ONO film.

For a CMOS MBCFET according to some embodiments of the present invention, the plurality of thin bridges 4a, 4b and 4c are connected to source/drain regions 3 and source/drain regions 3 are formed to have a uniform doping profile in a direction perpendicular to the plurality of bridges 4a, 4b and 4c, which can maintain the uniform source/drain junction capacitance even though the number of the bridges (and, thus, channels) increases. So, while reducing the junction capacitance, the current can increase to enhance the device speed.

For a CMOS MBCFET according to some embodiments of the present invention, an MOS transistor having a gate electrode smaller than a bridge width may be provided in some embodiments of the present invention because gate electrode 6 surrounds the plurality of bridges 4a, 4b and 4c, which can result in an improvement in the device integration.

In addition, for a CMOS MBCFET according to some embodiments of the present invention, regions of the active pattern where source/drain regions are to be formed are etched away. Then, the etched regions are provided with and/or filled up with an epitaxial single crystalline film and/or a conductive material to form source/drain regions 3. Accordingly, the active pattern is represented substantially solely by the remaining bridge-region, so that a horizontal length of tunnel 2 filled with the gate electrode may be limited within a gate length region to thereby obtain a highly integrated MOS transistor having a smaller gate length than a bridge width.

Figure 2B:
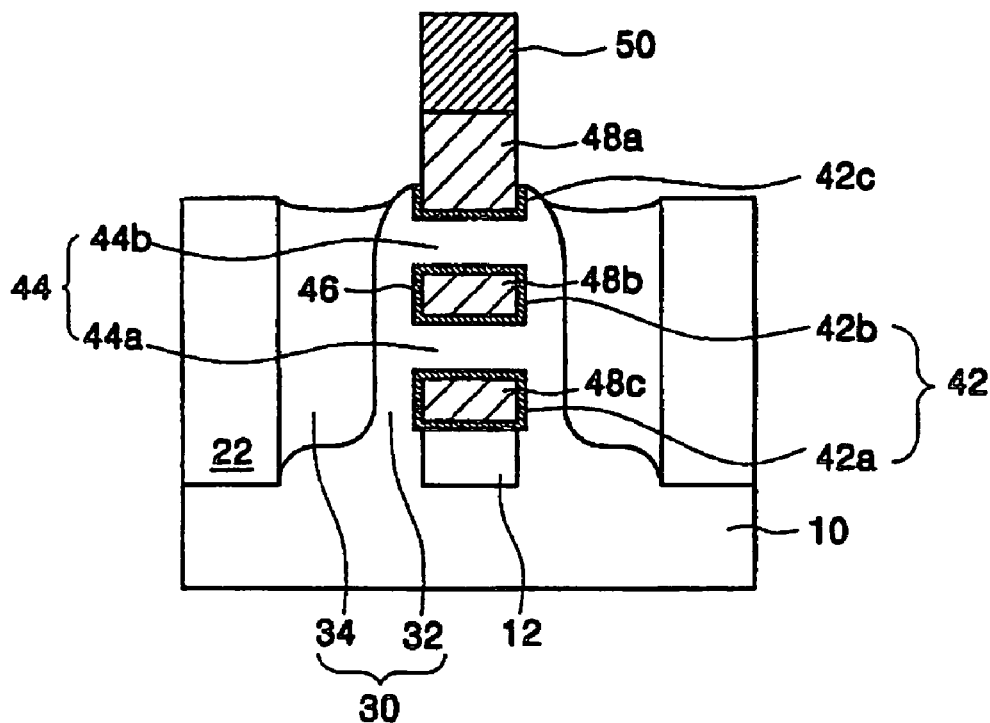
FIGS. 2B and 2C are cross-sectional views of the device of FIG. 2A taken along lines AA' and BB' of FIG. 2A, respectively.
Figure 2C:
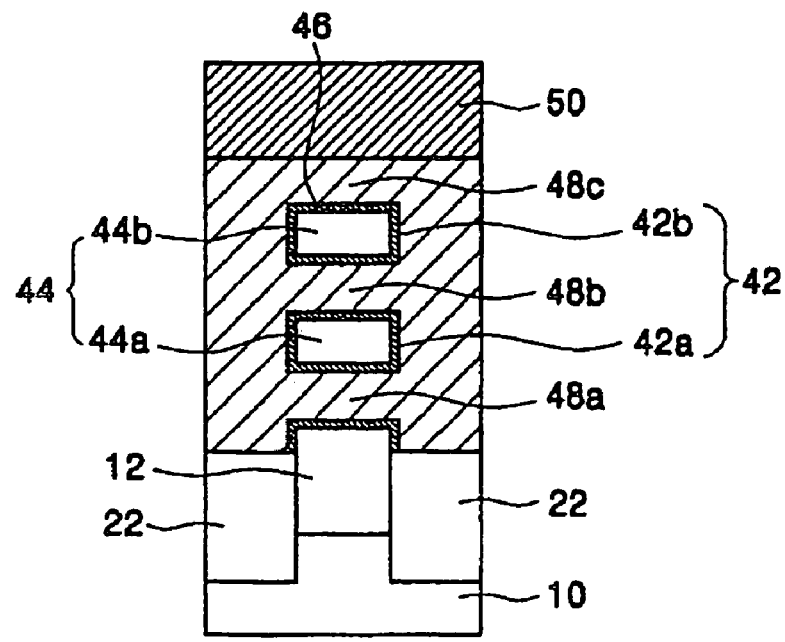

FIG. 2A, again, is a plan view of a semiconductor device in accordance with at least one embodiment of the present invention. FIGS. 2B and 2C are cross-sectional views of the semiconductor device taken along lines AA' and BB' of FIG. 2A, respectively.

Referring to FIGS. 2A to 2C, an active pattern 30 including multiple bridges 44 having a plurality of bridges 44a and 44b formed vertically in the upside direction is formed on a main surface of a substrate 10 comprising silicon (Si), silicon germanium (SiGe), silicon-on-insulator (SOI), silicon germanium-on-insulator (SGOI) and/or other conventional materials/layers. Source/drain regions 34 are formed so as to be connected to bridges 44a and 44b at opposite sides of active pattern 30. Between source/drain regions 34 and the plurality of bridges 44a and 44b, there are formed source/drain extension layers 32 connected to source/drain regions 34 and connected to bridges 44a and 44b. That is, source/drain extension layers 32 serve to couple source/drain regions 34 to the plurality of bridges 44a and 44b.

A plurality of tunnels 42 is formed between the plurality of bridges 44a and 44b. The lowest tunnel 42a is formed between the lowest bridge layer 44a and the underlying surface portion of the semiconductor substrate, e.g., a heavily doped impurity region 12 of substrate 10. A groove 42c corresponding in shape to tunnels 42a and 42b is formed on the uppermost bridge 44b.

Bridges 44a and 44b may comprise a semiconductor material such as single crystalline Si, while source/drain regions 34 may comprise a conductive material such as polysilicon, metal, metal silicide, etc. Here, source/drain extension layers 32 are formed to be extended from bridges 44a and 44b using the same material as in bridges 44a and 44b. In some embodiments of the present invention, source/drain extension layers 32 are comprised of selective epitaxial single crystalline Si.

On active pattern 30, there is formed a gate electrode 48 extending through and/or filling up tunnel 42 including the plurality of tunnels 42a and 42b formed between bridges 44a and 44b and surrounding bridges 44a and 44b in a vertical direction. A gate-insulating layer 46 is formed between gate electrode 48 and bridges 44a and 44b, e.g., on the inner surfaces of tunnel 42 and on the inner sidewalls and bottom surfaces of groove 42 of a tunnel shape. In some embodiments of the present invention, gate electrode 48 comprises a polysilicon and a gate stack layer 50 of a metal silicide for reducing a gate resistance is formed on the top surface of gate electrode 48.

Field regions 22 are formed so as to surround source/drain regions 34 except the bridge-region represented by the plurality of bridges 44a and 44b. A heavily doped region 12 is formed in the main surface portion of substrate 10 below active pattern 30, e.g., below the lowest bridge 44a. Heavily doped region 12 can reduce or prevent the operation of a bottom transistor causing a short channel effect.

Figure 3A:
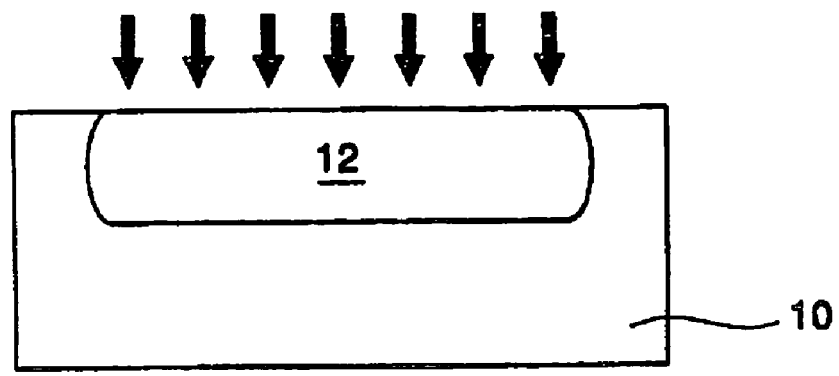
FIGS. 3A to 3R are cross-sectional views illustrating methods of manufacturing an MBCFET device as in FIGS. 2A-2C, according to at least one other embodiment of the present invention.
Figure 3B:
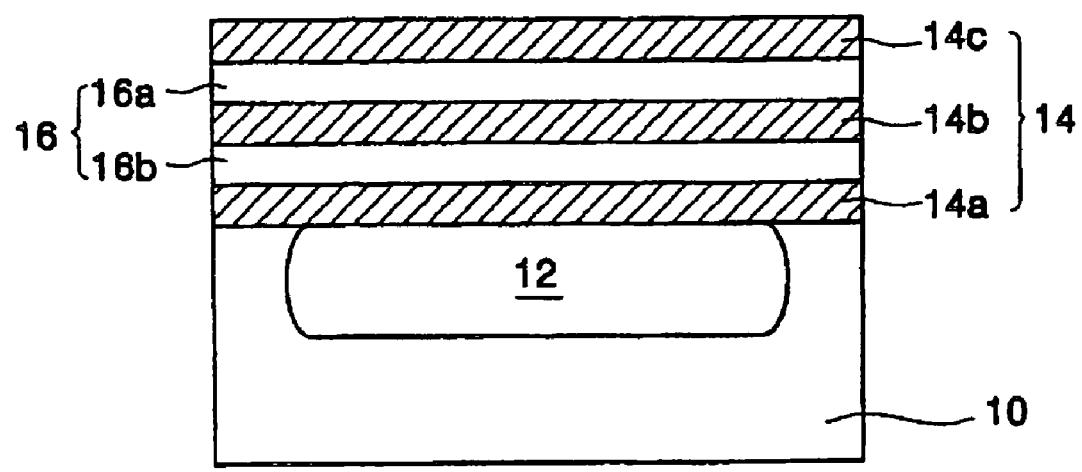
Figure 3C:
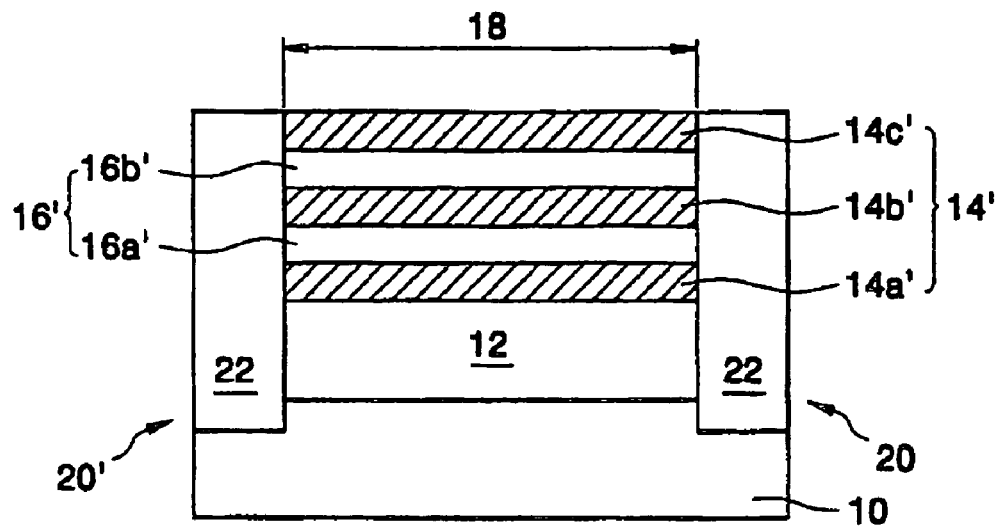
Figure 3D:
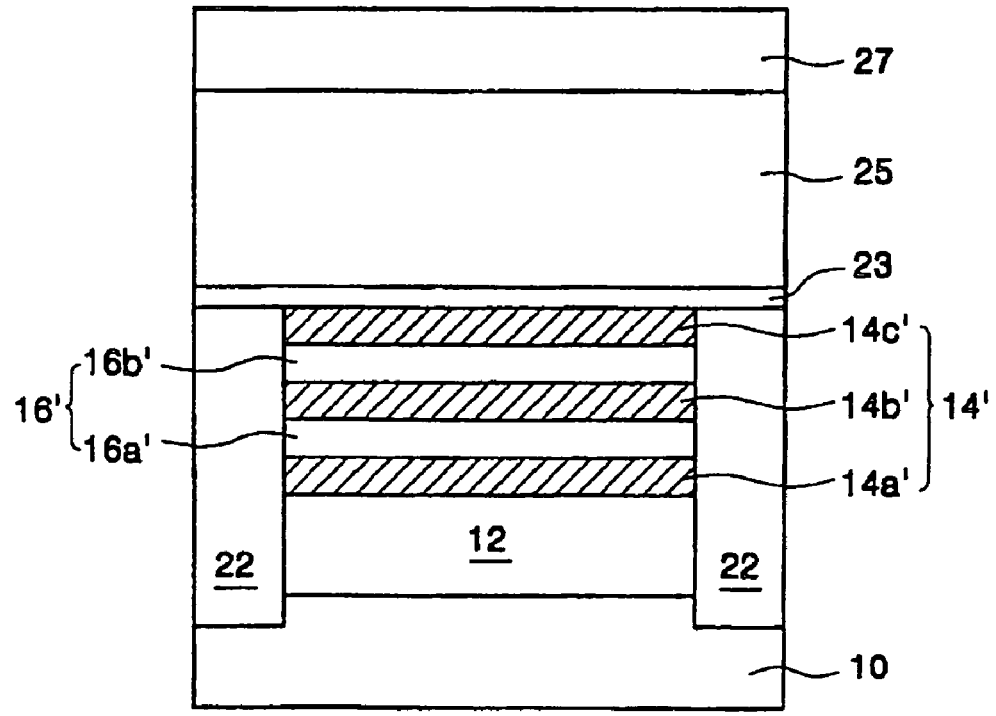
Figure 3E:
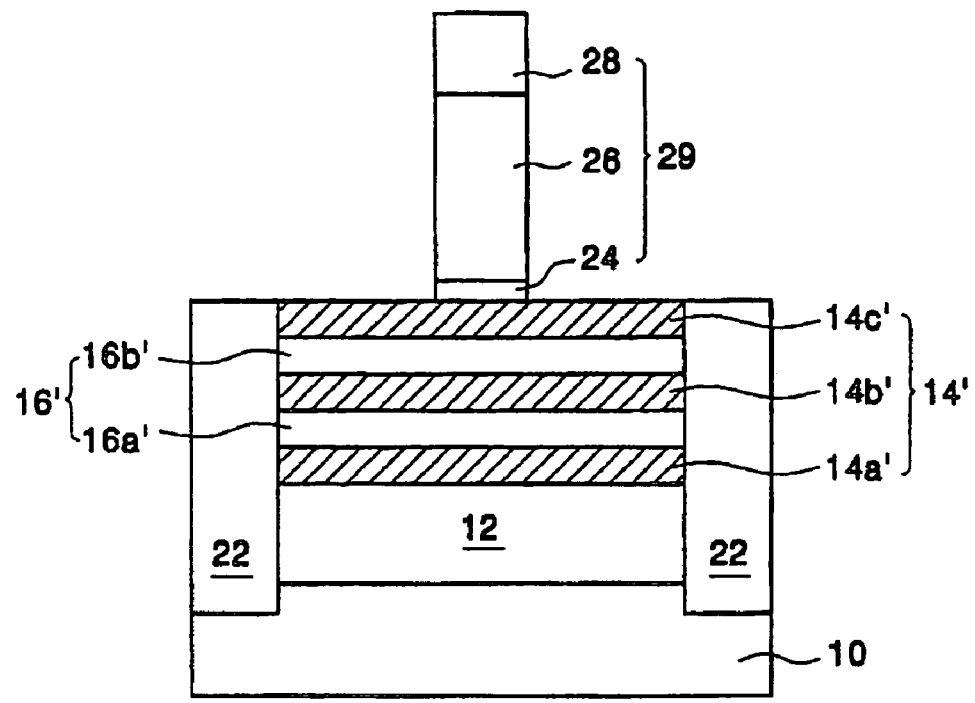
Figure 3F:
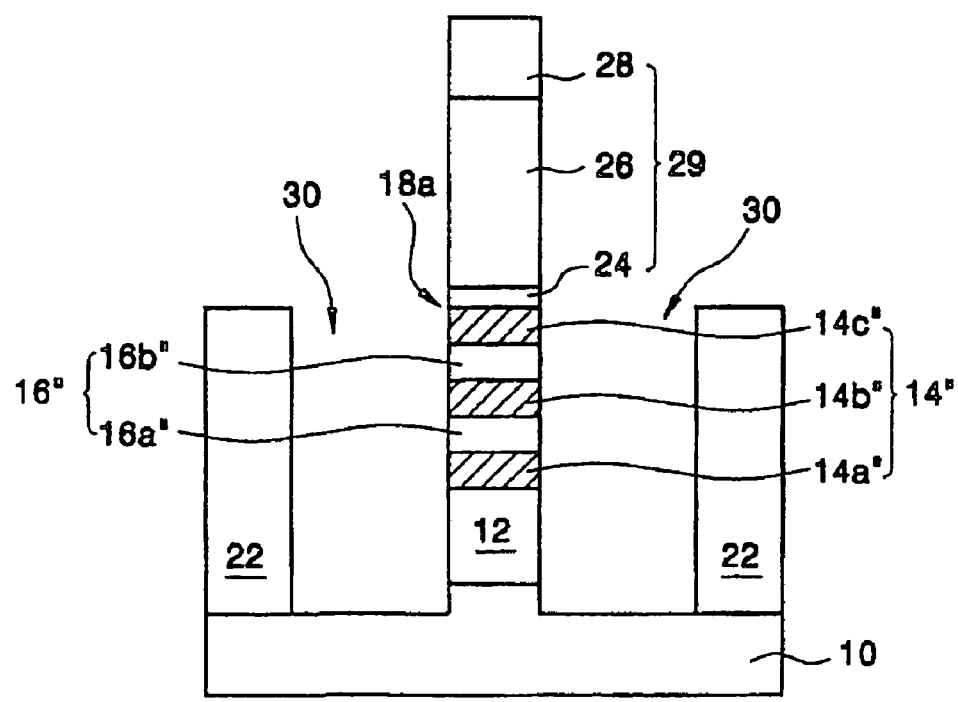
Figure 3G:
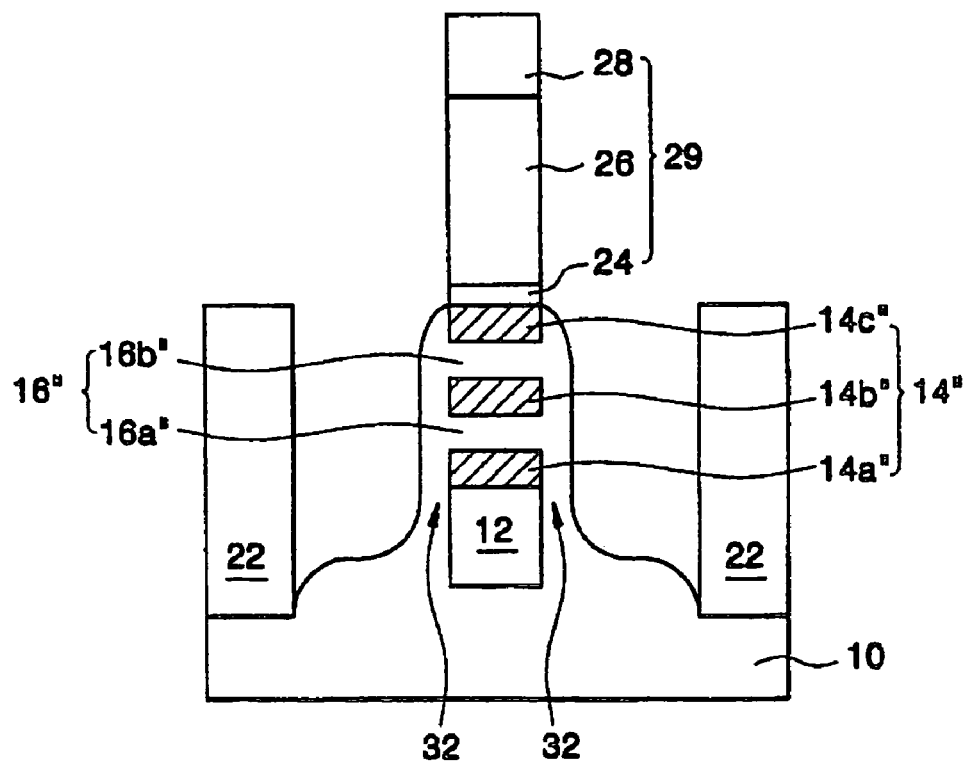
Figure 3H:
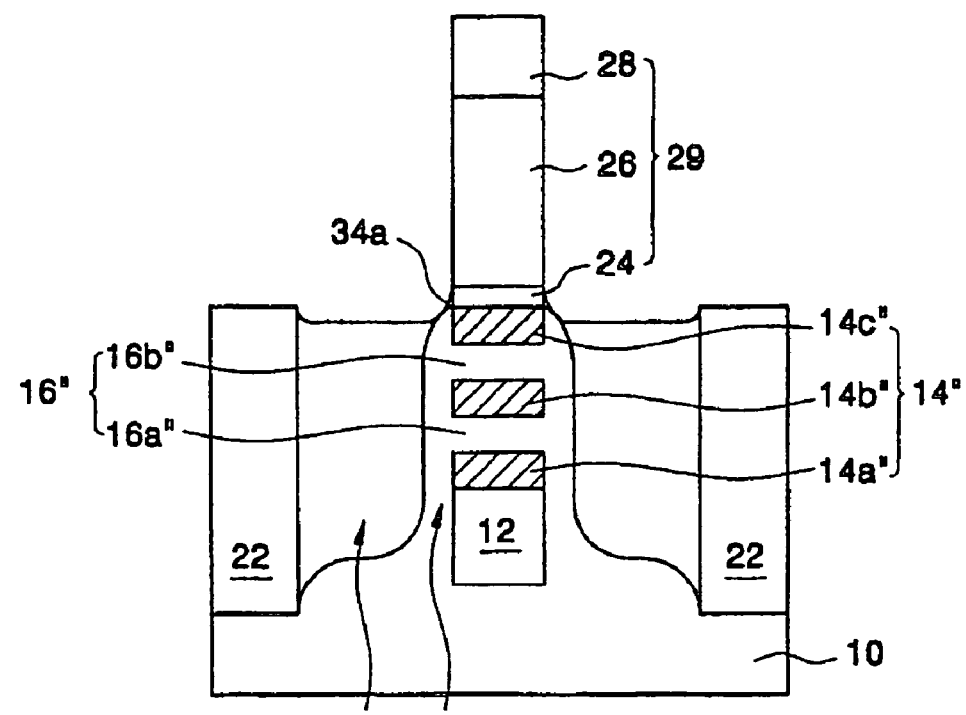
Figure 3I:
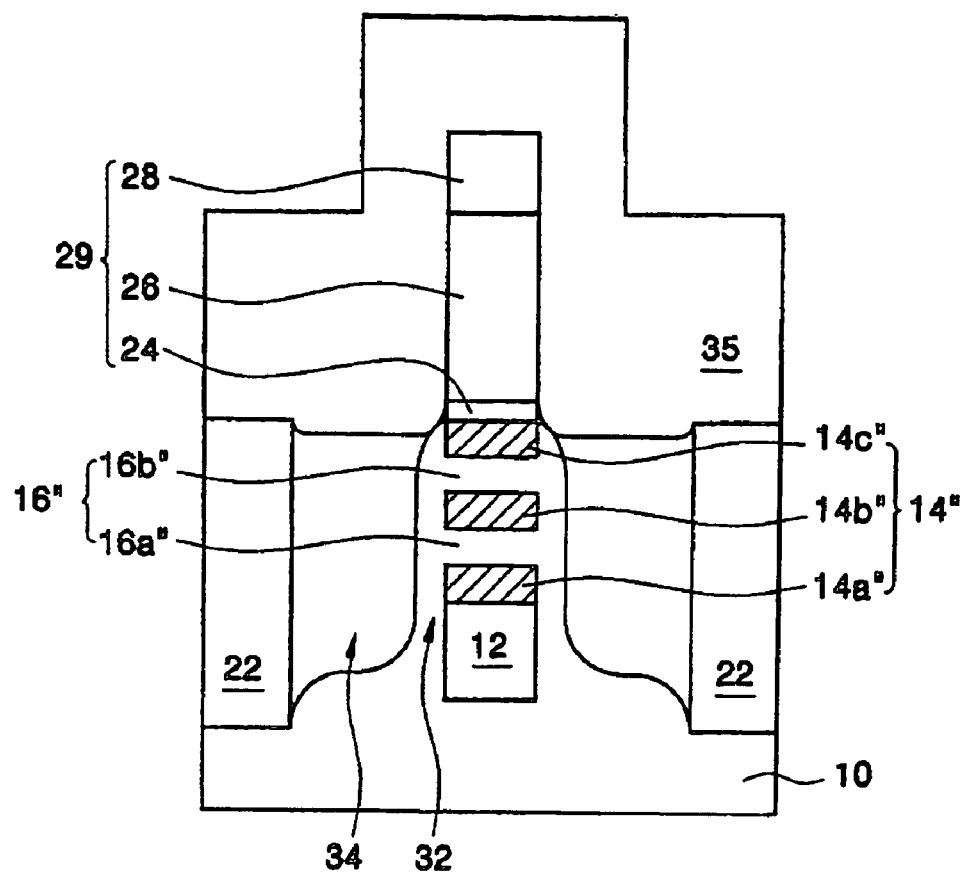
Figure 3J:
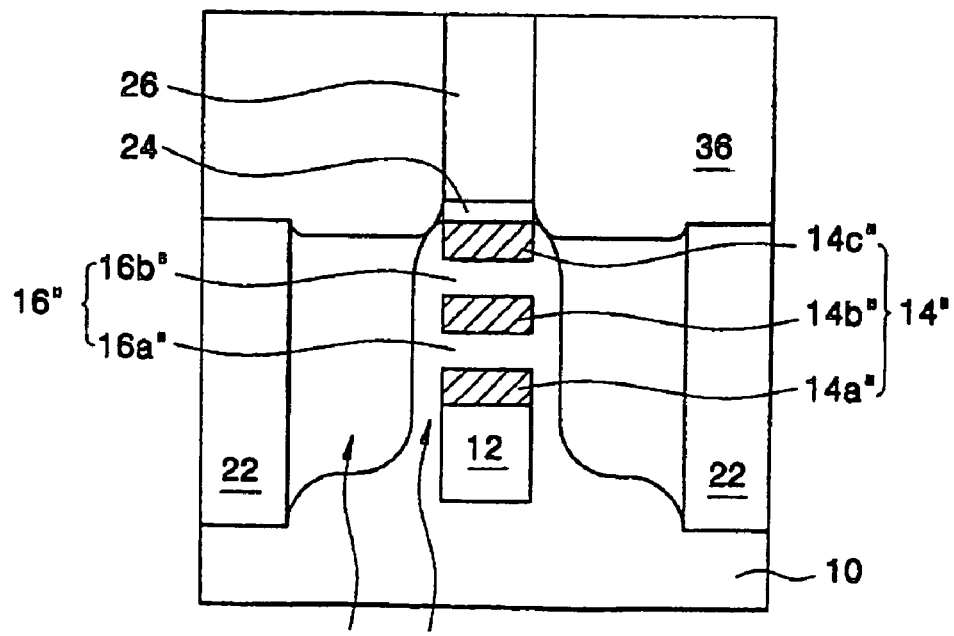
Figure 3K:
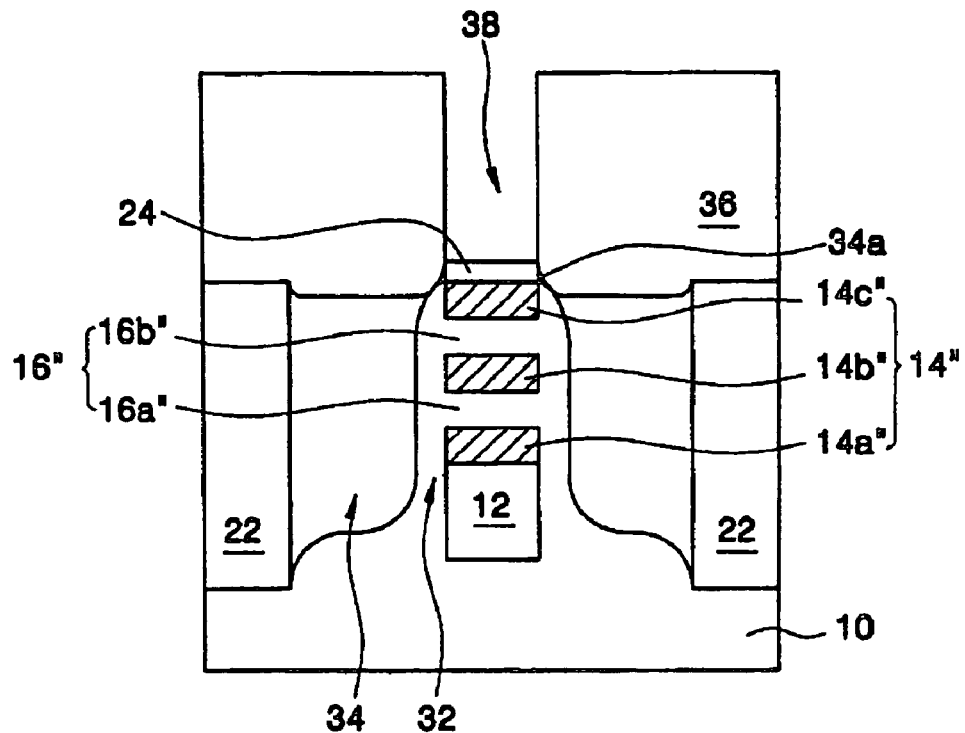
Figure 3L:
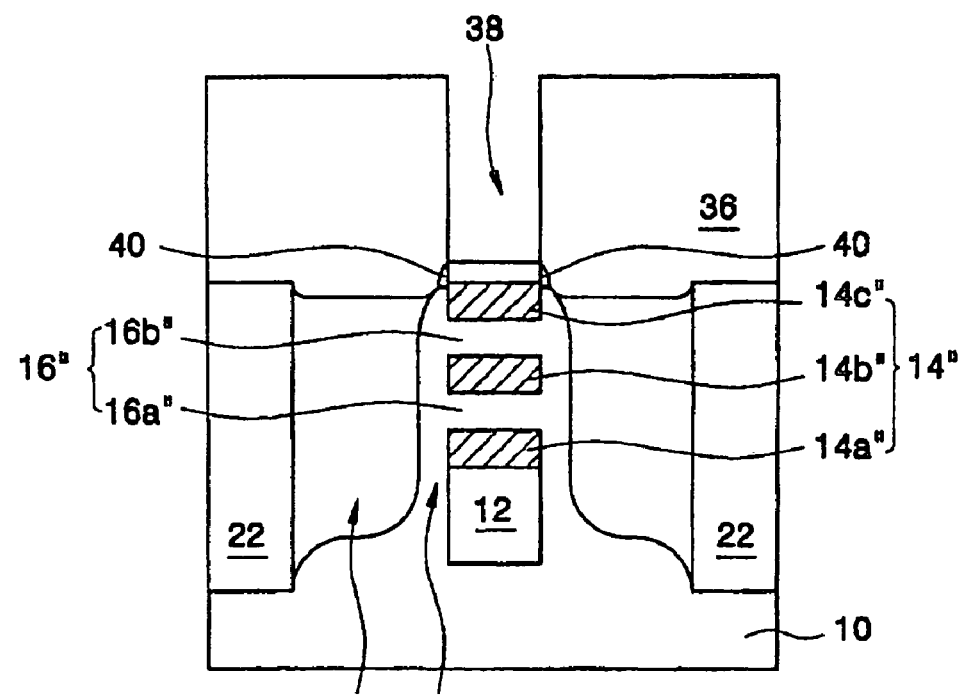
Figure 3M:
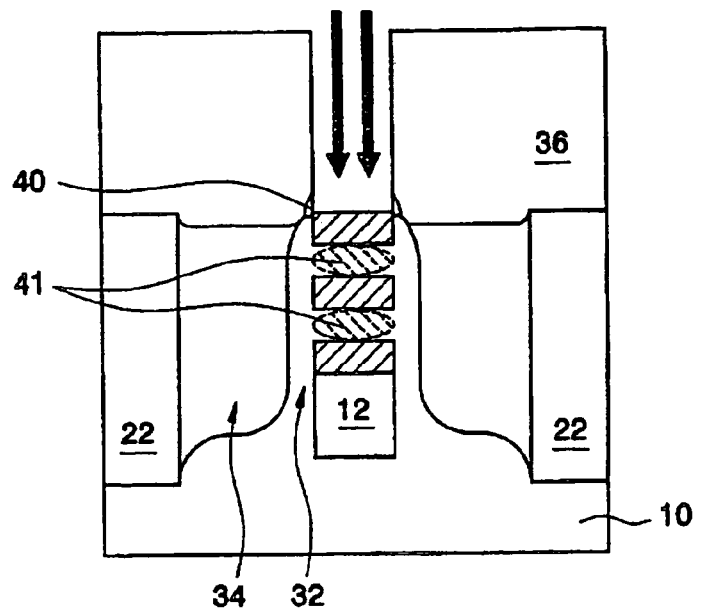
Figure 3N:
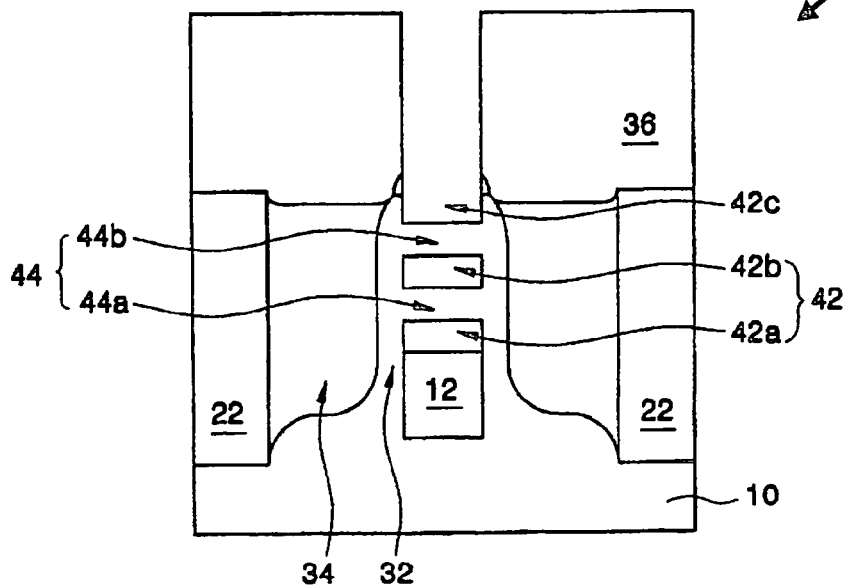
Figure 3O:
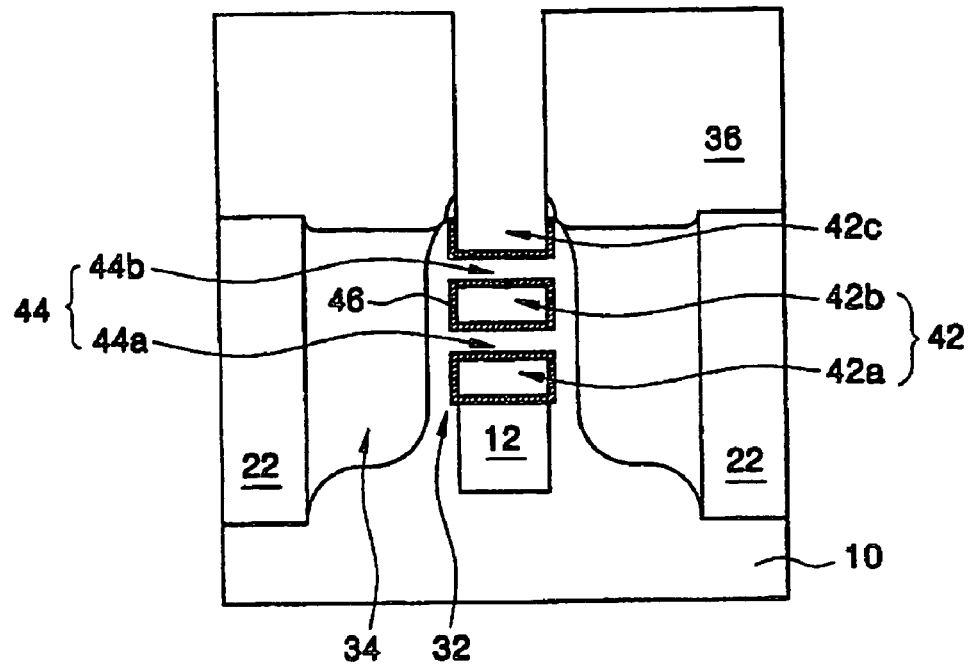
Figure 3P:
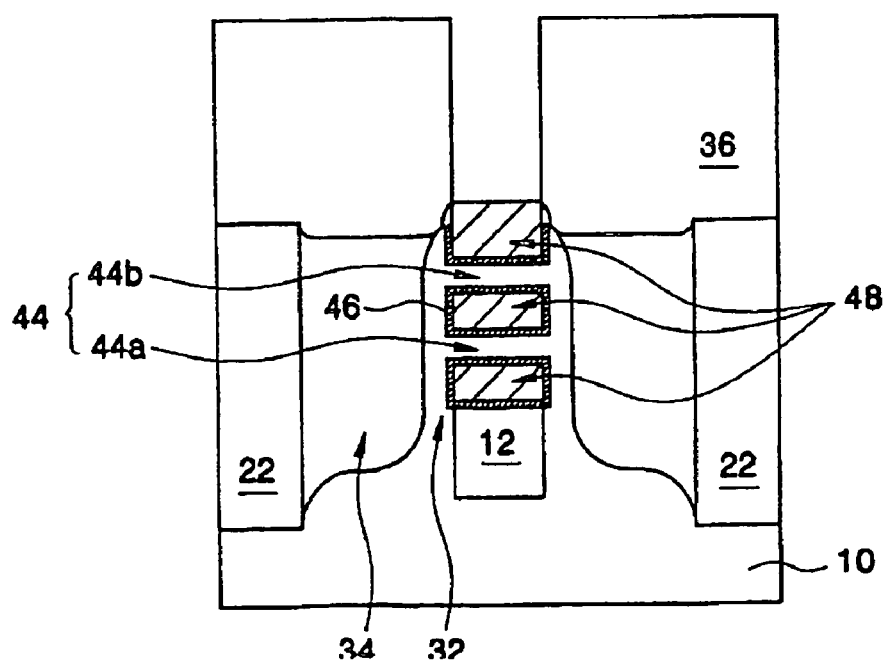
Figure 3Q:
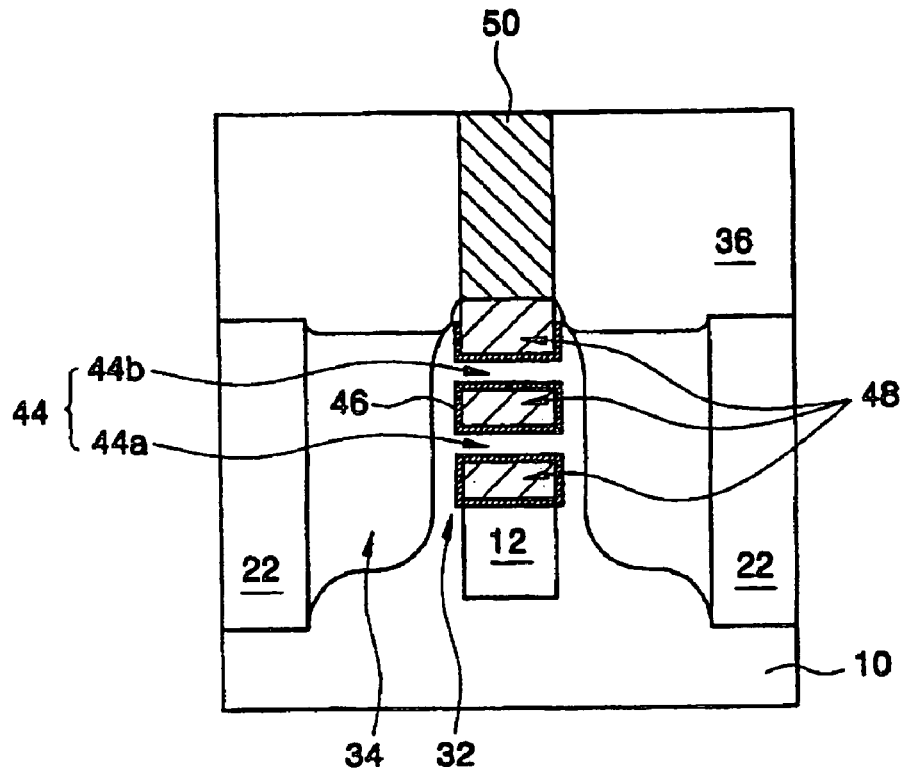
Figure 3R:
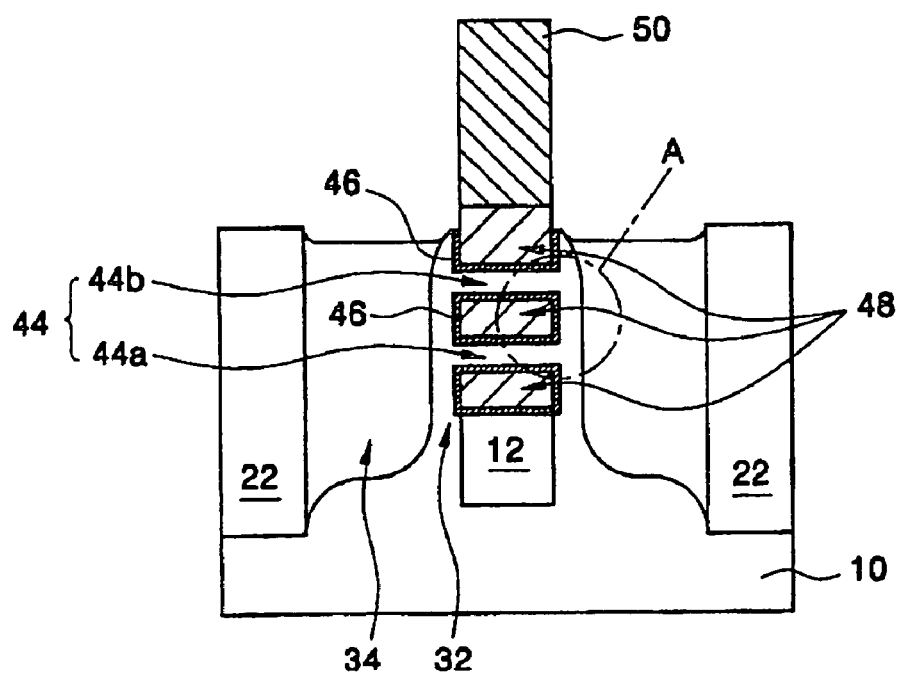

FIGS. 3A to 3R are cross-sectional views (taken from the same perspective as FIG. 2B) illustrating methods of manufacturing a CMOS MBCFET device (such as depicted in FIGS. 2A-2C) according to at least one other embodiment of the present invention. FIGS. 4A to 4G are perspective views further illustrating some steps of the methods (depicted in FIGS. 3A-3R) of manufacturing a CMOS MBCFET device according to at least one other embodiment of the present invention.

Referring to FIG. 3A, an impurity of the same conductivity type as that of a substrate 10 is ion-implanted into a main surface of substrate 10 to form a heavily doped region (well region) 12 which can reduce or prevent the operation of a bottom transistor. Substrate 10 comprises silicon (Si), silicon germanium (SiGe), silicon-on-insulator (SOI), silicon germanium-on-insulator (SGOI) and/or other conventional substrates/layers. In some embodiments, semiconductor substrate 10 comprises single crystalline Si.

Referring to FIG. 3B, a plurality of interbridge layers 14 and a plurality of bridge layers 16 are stacked alternately upon each other on substrate 10. First, a first interbridge layer 14a is formed on substrate 10, and then, a first bridge layer 16a is formed on the first interbridge layer 14a. An uppermost interbridge layer 16c is formed at an uppermost position.

Bridge layers 16 and interbridge layers 14 are comprised of single crystalline semiconductor materials having an etch selectivity with respect to each other. Bridge layers 16 can be formed, e.g., from a single crystalline Si epitaxial film having a thickness of, e.g., about 300 Å. Interbridge layers 14 can be formed, e.g., from a single crystalline SiGe epitaxial film having a thickness of, e.g., about 300 Å.

The repeating number and thickness of bridge layers 16 and interbridge layers 14 can be controlled in accordance with a purpose of a transistor to be formed. In some embodiments, bridge layers 16 and interbridge layers 14 are stacked alternately with each other such that the total thickness falls in a range of about 100 to about 1500 Å. Here, in order to perform a channel doping, bridge layers 16 may be formed of a doped single crystalline Si epitaxial film.

Referring to FIG. 3C, the plurality of bridge layers 16 and the plurality of interbridge layers 14 are patterned through a photolithography process to form a pre-active pattern 18 (corresponding to the precursor to bridge-region 1) having a first bridge layer pre-pattern (or first bridge layer preliminary pattern) 16' and a first interbridge layer pre-pattern (or first interbridge layer preliminary pattern) 14'. The first bridge layer pre-pattern 16' comprises a plurality of first bridge layer patterns 16a' and 16b'. The first interbridge layer pre-pattern 14' comprises a plurality of interbridge layer patterns 14a', 14b' and 14c'. The etching process is performed for sufficient time to form an isolation trench 20 having a depth deeper than that of impurity region 12 in substrate 10.

Next, an oxide layer is deposited by a chemical vapor deposition (CVD) method so as to fill up isolation trench 20. The deposited oxide layer is planarized by an etch-back process or a chemical mechanical polishing (CMP) process until the surface of pre-active pattern 18 is exposed, thereby forming field regions 22 surrounding pre-active pattern 18.

Referring to FIG. 3D, an etch-stopping layer 23, a dummy gate layer 25 and an anti-reflective layer 27 are successively stacked on substrate 10 including pre-active pattern 18. Etch-stopping layer 23 is formed to a thickness of, e.g., about 100 to about 200 Å by a material having an etch selectivity with respect to dummy gate layer 25, such as silicon nitride. Etch-stopping layer 23 plays a role of reducing or preventing the underlying pre-active pattern from being etched during etching of dummy gate layer 25. Dummy gate layer 25 for defining a gate region is formed to a thickness of, e.g., about 1000 Å by silicon oxide. Anti-reflective layer 27 for reducing or preventing the reflection of light from the lower substrate during a photolithography process is formed to a thickness of, e.g., about 300 Å by using silicon nitride.

Referring to FIG. 3E, through a photolithography process, anti-reflective layer 27, dummy gate layer 25 and etch-stopping layer 23 are successively dry-etched away to form a gate hard mask 29 having an anti-reflective layer pattern 28, a dummy gate pattern 26 and an etch-stopping layer pattern 24. Gate hard mask 29 has a width of, e.g., about 0.2 to about 0.3 microns and plays a role of self-aligning the source/drain regions to the bridge-region.

Referring to FIG. 3F, using gate hard mask 29 as an etching mask, the exposed pre-active pattern 18 is etched away until the surface of substrate 10 is exposed, thereby defining regions 30 where the source/drain regions are to be formed. Thus, only a bridge-region of pre-active pattern 18 remains. At this time, the etching process is preformed for sufficient time to etch the upper portion of semiconductor substrate 10 to below the projected range of heavily doped region 12.

As a result, there are formed a bridge-region of an active pattern 18a including a second bridge layer pattern 16" and a second interbridge layer pattern 14" under gate hard mask 29 as shown in the figure. The second bridge layer pattern 16" is comprised of a plurality of second bridge layer patterns 16a" and 16b" and the second interbridge layer pattern 14" is comprised of a plurality of interbridge layer patterns 14a", 14b" and 14b".

In a conventional GM structure where the active region is not etched and utilized as the source/drain regions, the tunnel may extend horizontally to increase the length of the gate electrode when isotropically etching the interbridge layer. In contrast, in some embodiments of the present invention, the regions of the active pattern where the source/drain regions are to be formed are etched and then, the etched regions are filled up with a conductive material to form the source/drain. Accordingly, since the horizontal length of interbridge layers 14 in the bridge-region of active pattern 18a can be limited within the gate length region, it can reduce or prevent tunnels from extending horizontally when the second interbridge layers 14" are isotropically etched to form the tunnels in a subsequent process. So, a highly integrated MOS transistor having a gate length smaller than a bridge width can be obtained.

Referring to FIG. 3G, a selective epitaxial single crystalline film is partially grown to a thickness of, e.g., about 300.about 400 Å on the surfaces of etched regions 30 of semiconductor substrate 10 on the side of the bridge-region of active pattern 18a, thereby forming source/drain extension layers 32. Here, the selective epitaxial single crystalline film is doped by a tilted ion implantation so that each of second bridge layer patterns 16a" and 16b" have a uniform source/drain impurity concentration. In some cases, with or without performing the ion implantation, a dopant is solid-phase diffused from source/drain regions that are heavily doped in a subsequent annealing process to thereby form source/drain extension layers 32 having a uniform source/drain doping concentration with respect to each of bridge layers 16.

Referring to FIG. 3H, a conductive material is deposited on source/drain extension layers 32, and in some embodiments so as to completely fill up etched regions 30, thereby forming a conductive film. Then, the conductive film is etched back to the surface of the bridge-region of active pattern 18a to form source/drain regions 34 comprising the heavily doped conductive film only within etched regions 30.

In some embodiments, the conductive material comprises doped polysilicon, metal and/or metal silicide. As described above, in some embodiments, source/drain regions 34 have a uniform doping profile vertically along the bridge-region of active pattern 18a because source/drain regions 34 are formed by deposition. Here, tails 34a of the conductive film for the source/drain may remain under the side of gate hard mask 29.

Optionally, in order to reduce the surface roughness of source/drain extension layers 32 comprising the epitaxial single crystalline film and to recrystallize source/drain extension layers 32, a heat treatment may be performed at a high temperature in a hydrogen ($H_2$) ambient before depositing the conductive film.

Referring to FIG. 3I, silicon nitride is deposited so as to cover gate hard mask 29 on source/drain regions 34 and field regions 22, thereby forming a mask layer 35. Preferably, mask layer 35 comprises the same material as that of the uppermost layer constituting gate hard mask 29, e.g., anti-reflective layer pattern 28. Here, before depositing mask layer 35, an oxide layer may be formed by oxidizing the surface portions of source/drain regions 34 and the exposed surface portion of the bridge-region of active pattern 18a through a thermal oxidation process. This oxide layer serves as a stress-buffering layer.

Figure 4A:
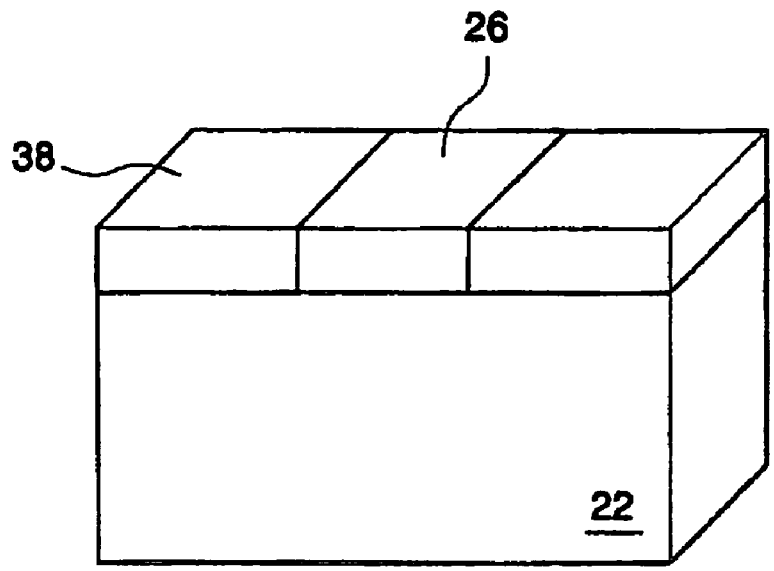
FIGS. 4A to 4G are perspective views illustrating some steps of the methods of manufacturing the MBCFET device of FIGS. 3A to 3R, according to at least one other embodiment of the present invention.

Referring to FIG. 3J, until the surface of dummy gate pattern 26 is exposed, mask layer 35 is removed by etch-back or chemical mechanical polishing to form mask patterns 36 exposing dummy gate pattern 26. FIG. 4A is a perspective side view particularly illustrating the step as shown in FIG. 3J.

Figure 4B:
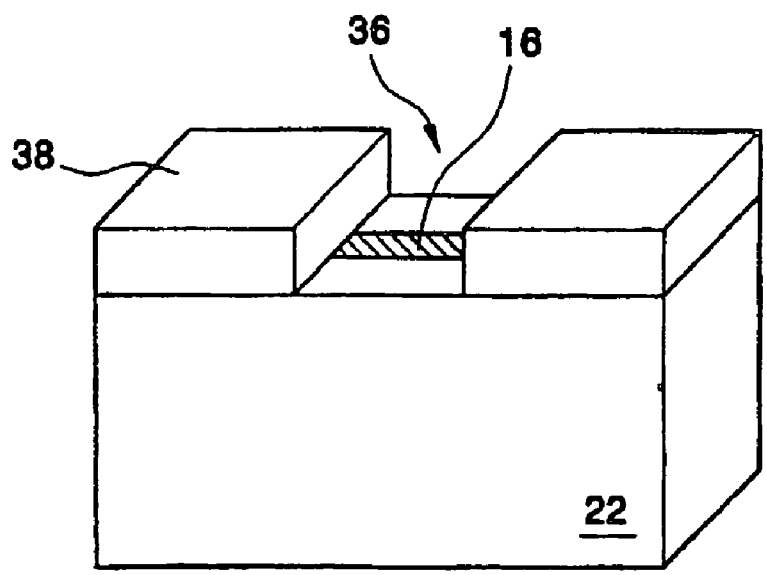

Referring to FIG. 3K, using mask patterns 36, dummy gate pattern 26 is selectively removed to form a gate trench 38. Etch-stopping layer pattern 24 reduces or prevents the underlying pre-active pattern 18 from being etched during the etching process of removing dummy gate pattern 26. FIG. 4B is a perspective side view particularly illustrating the step as shown in FIG. 3K.

Referring to FIG. 3L, if conductive tails 34a remain under the sides of gate hard mask 29, an oxidation process and/or a wet etching process is executed to remove conductive tails 34a. In some embodiments, the oxidation process is carried out to convert conductive tails 34a into insulating layers 40, thereby preventing conductive tails 34a from being short-circuited with a gate electrode to be formed in a subsequent process.

Referring to FIG. 3M, etch-stopping layer pattern 24 exposed through gate trench 38 is removed.

When the bridge-region of active pattern 18a is not doped with impurities, a channel ion implantation is locally performed through gate trench 38 to thereby dope the bridge-region of active pattern 18a with impurities. In some embodiments, the channel ion implantation is carried out such that the projected range is formed within each of second bridge layer patterns 16a" and 16b". Here, the reference numeral 41 indicates the channel ion-implanted regions. Further, in some embodiments, the channel ion implantation is executed such that each of second bridge layer patterns 16a" and 16b" may have different doping concentrations from each other, thereby obtaining a transistor that may be operated according to the applied gate voltage.

Figure 4C:
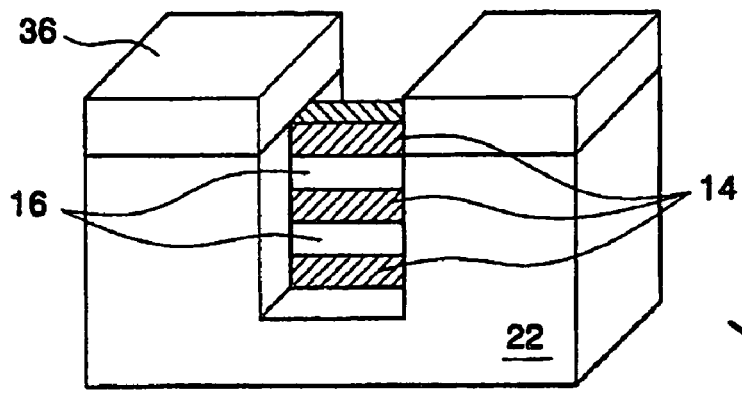

Next, using source/drain regions 34 as an etching mask, field regions 22 are selectively etched away to expose the sides of the bridge-region of active pattern 18a, as shown in FIG. 4C. FIG. 4C is a perspective side view particularly showing a portion that is not shown in the cross-sectional view of FIG. 3M.

Referring to FIG. 3N, using an isotropic etching process that uses a PAA-based etchant (as discussed above), the plurality of interbridge layer patterns 14a", 14b" and 14c" are selectively removed to form a plurality of tunnels 42a and 42b passing through the bridge-region of active pattern 18a and a tunnel groove 42c in a tunnel shape, tunnel groove 42c being located at an uppermost position. Here, second bridge layer patterns 16a" and 16b" form a plurality of bridges 44a and 44b. Preferably, the plurality of tunnels 42a and 42b and the plurality of bridges 44a and 44b are formed to have the same width as that of dummy gate pattern 26 within a range of about 50%.

Figure 4D:
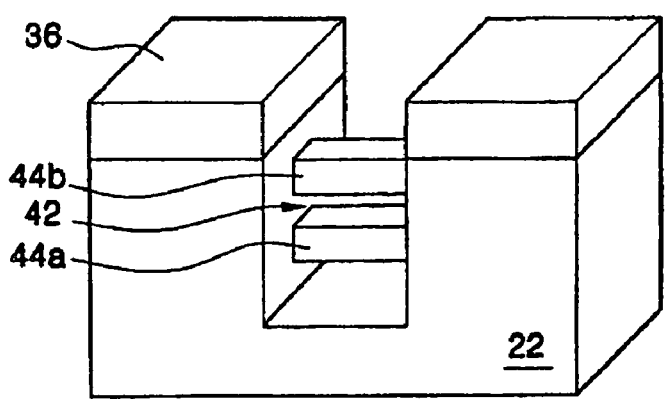

FIG. 4D is a perspective side view particularly illustrating the step as shown in FIG. 3N. As shown, the side surface portions of source/drain extension layers 32 are partially exposed through tunnels 42a and 42b.

Figure 4E:
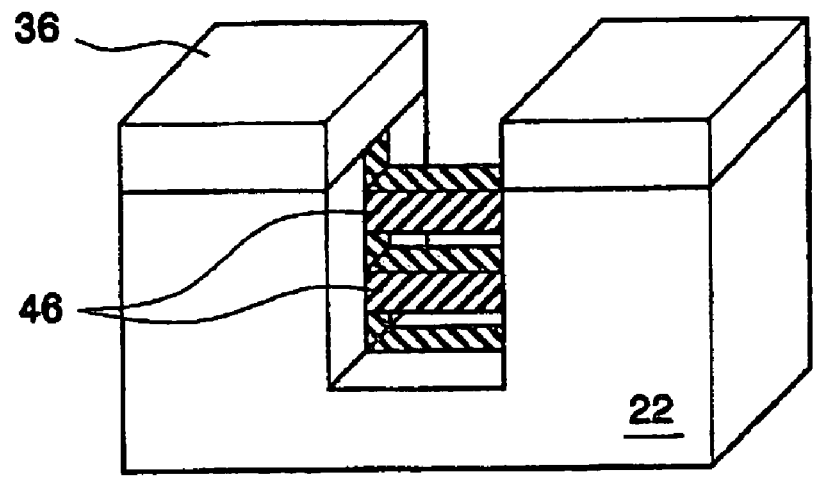

Referring to FIG. 3O, a thermal oxidation process is carried out to form a gate-insulating layer 46 to a thickness of, e.g., about 10 to about 70 Å on the surfaces of plurality of bridges 44a and 44b and the inner surface of tunnel groove 42c. FIG. 4E is a perspective side view particularly illustrating the step as shown in FIG. 3O. As shown in the figure, gate-insulating layer 46 is also continuously formed on a portion of the surfaces of source/drain extension layers 32 exposed by the bridges.

Here, in order to reduce the surface roughness of bridges 44a and 44b, a heat treatment may be performed at a high temperature in a hydrogen ($H_2$) or argon (Ar) ambient before forming gate-insulating layer 46, thereby decreasing the roughness between gate-insulating layer 46 and bridges 44. Alternatively, gate-insulating layer 46 may be comprised of silicon oxynitride.

Figure 4F:
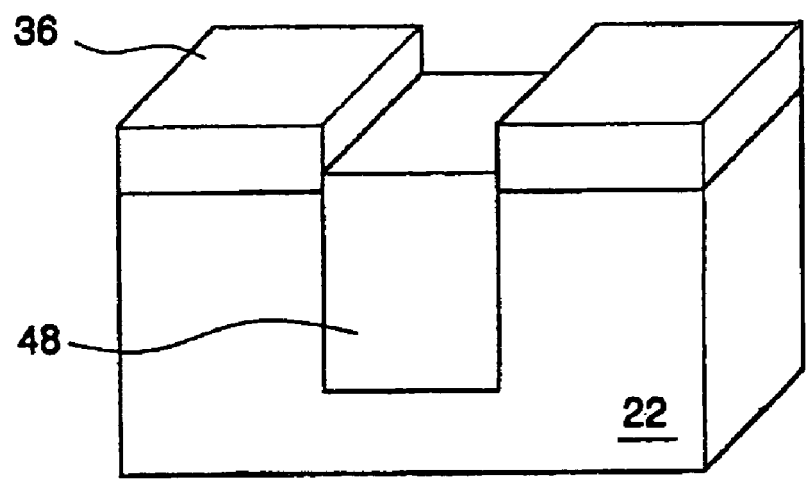

Referring to FIG. 3P, a gate electrode 48 is formed so as to fill up the plurality of tunnels 42a and 42b and tunnel groove 42c and to surround the plurality of bridges 44a and 44b. In some embodiments, gate electrode 48 comprises doped polysilicon. FIG. 4F is a perspective side view particularly showing the step as shown in FIG. 3P.

Figure 4G:
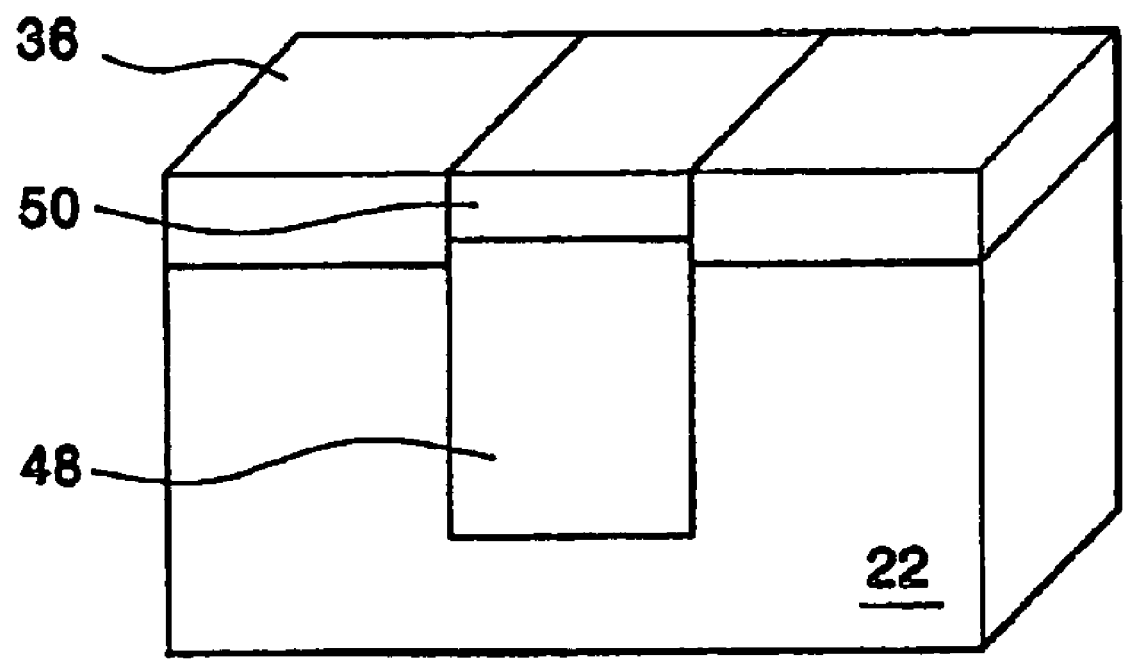

Referring to FIG. 3Q, a gate stack layer 50 including a metal silicide for reducing a gate resistance is formed on polysilicon gate electrode 48. Here, gate stack layer 50 may be comprised of an insulating material for capping the gate, e.g., silicon oxide or silicon nitride. FIG. 4G is a perspective side view illustrating the step as shown in FIG. 3Q.

Referring to FIG. 3R, mask patterns 36 are removed and then, subsequent processes such as metal interconnection are carried out to complete a vertical MOS transistor having multiple bridges in which can be induced multiple channels. In some cases, mask patterns 36 may remain to serve as an insulating interlayer.

Figure 7A:
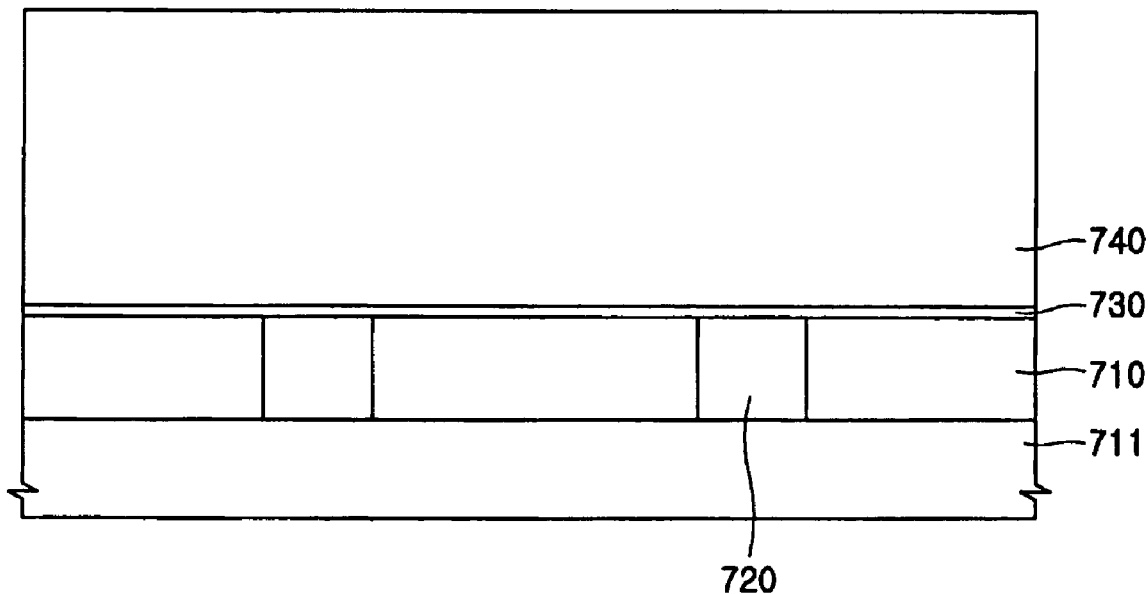
FIGS. 7A through 7L are cross-sectional views illustrating a method of manufacturing a capacitor for a semiconductor device according to at least one embodiment of the present invention. and And FIG. 8 is a cross-sectional view of a capacitor lower (or, in other words, storage) electrode of a semiconductor device according to at least one other embodiment of the present invention.

FIGS. 7A through 7L are cross-sectional views illustrating a method of manufacturing a capacitor for a semiconductor device according to at least one embodiment of the present invention; and Referring to FIG. 7A, to form a semiconductor device having a storage node according to at least one embodiment of the present invention, a first insulating layer 7710 having a contact plug 720 formed therein is formed on a semiconductor substrate 711. First insulating layer 7710 can be formed of a dielectric material, e.g., an oxide. Substrate 711 may be, e.g., a semiconductor wafer such as a silicon wafer or a material layer formed thereon. Although not shown, a lower structure (that may include source/drain regions and gate electrodes) can be formed on semiconductor substrate 711 to form, e.g., a transistor or a memory cell. Contact plug 720 is electrically connected to a storage node formed thereon. Contact plug 720 is also electrically connected to active regions of semiconductor substrate 711. Although not shown, contact plug 720 may be connected to the active regions via a contact pad. First insulating layer 710 may be planarized.

Next, an etch stop layer 730 and a first moulding layer 740 are sequentially formed on first insulating layer pattern 710. Etch stop layer 730 may be formed of a material having an etch selectivity with respect to first moulding layer 740, e.g., silicon nitride. As its name suggests, etch stop layer 730 can serve as an end point during a subsequent etching lift-off process to remove first moulding layer 740. First moulding layer 740 may be formed of SiGe, e.g., epitaxially grown to a thickness, e.g., between about 3,000 to about 20,000 Å.

Figure 7B:
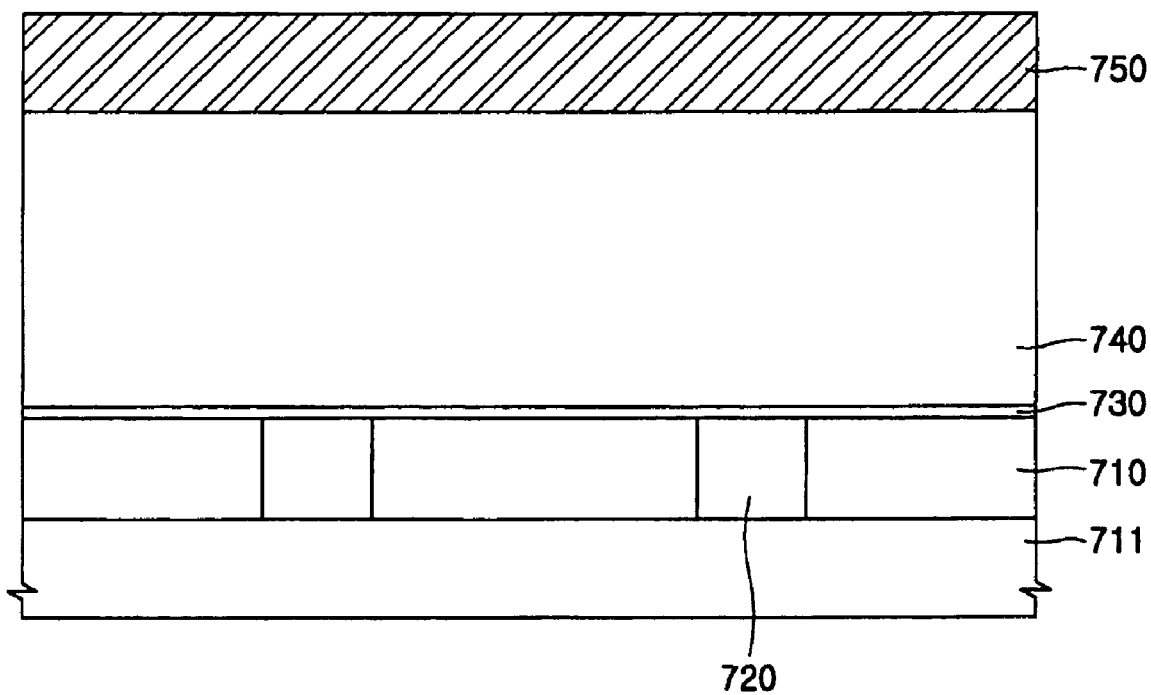

Referring to FIG. 7B, a photoresist 750 is then formed on first moulding layer 740.

Figure 7C:
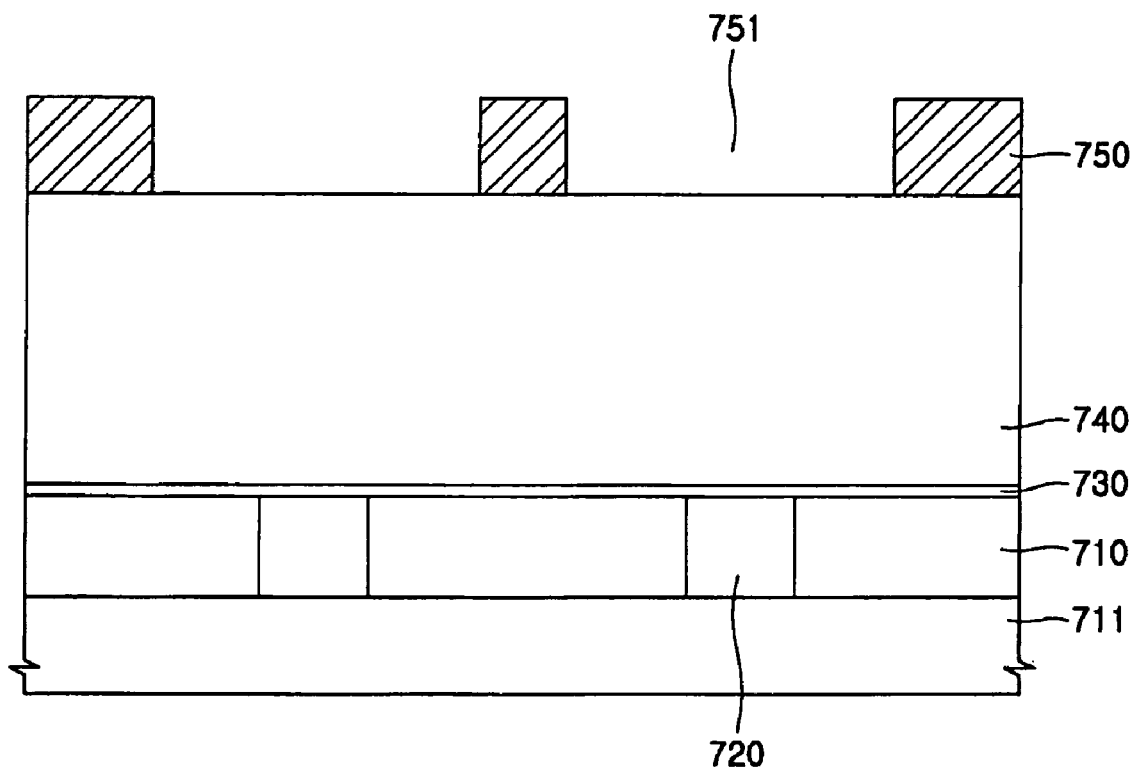

Referring to FIG. 7C, photoresist 750 can be patterned to form a photoresist pattern 750' having an opening 751 overlying contact plug 720.

Figure 7D:
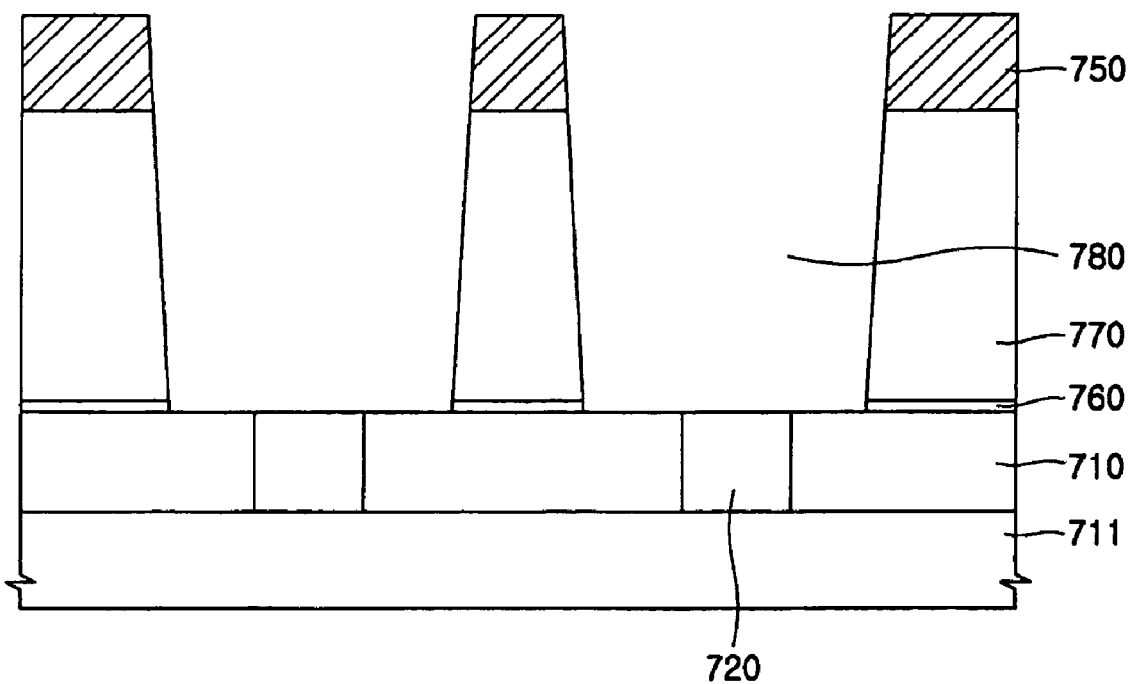

Referring to FIG. 7D, first moulding layer 740 and etch stop layer 730 are subsequently etched using photoresist pattern 750' as an etching mask, thereby forming a first moulding layer pattern 770 and an etch stop layer pattern 760, through which a storage node contact hole 780 extends.

Figure 7E:
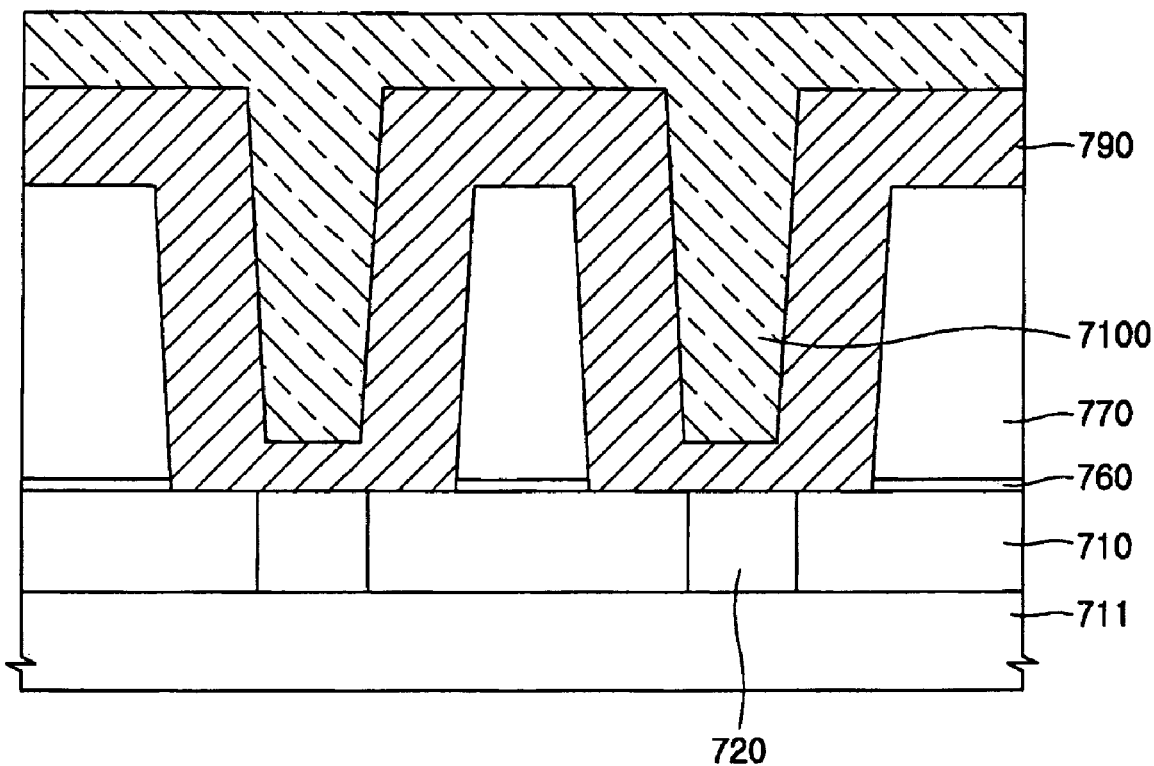

Turning to FIG. 7E, photoresist pattern 750' is then removed and a conductive layer 790 is conformally deposited over first moulding layer pattern 770, but does not completely fill storage node hole 780. Typically, in the Background Art, conductive layer 790 is formed to a thickness of about 400 Å. However, according to at least one embodiment of the present invention, the thickness of conductive layer 790 may be about 600 Å. Thus, the width of the storage node bottom portion can be increased, thereby improving the stability of the capacitor structure, as will explained further below. Conductive layer 790 can be formed of a material such as a doped polysilicon or a doped silicon. Then, a second moulding layer or a sacrificial layer 7100 can be formed to a thickness such that first moulding layer pattern 770 is completely covered. Second moulding layer 100 can also be formed of SiGe.

Figure 7F:
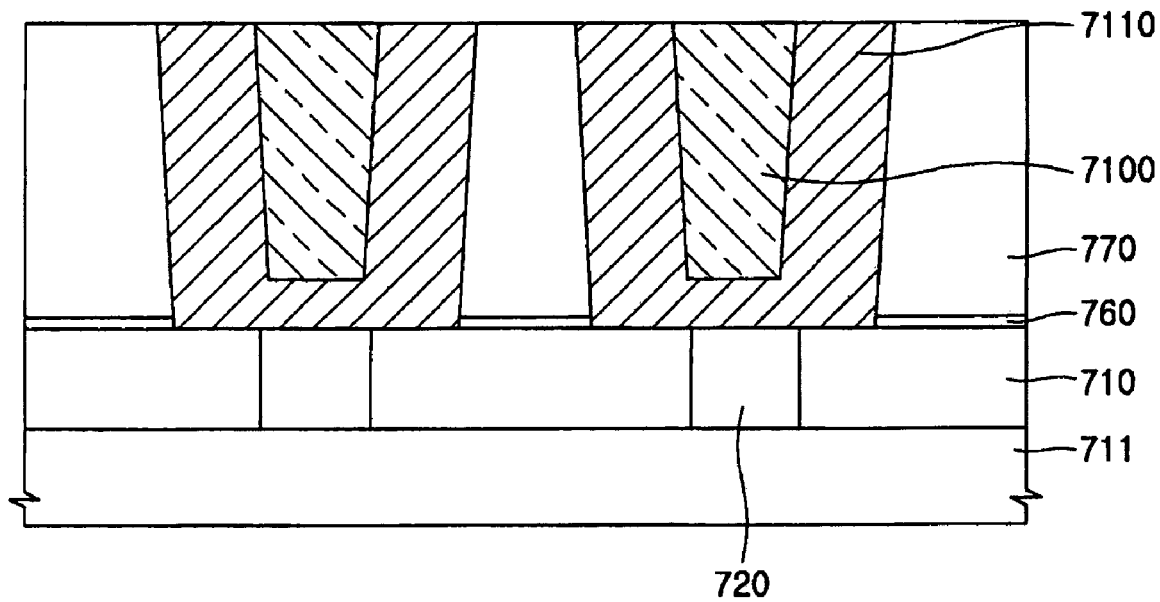

Referring to FIG. 7F, the resulting structure is planarized to form separated storage nodes 7110 using conventional planarization techniques, e.g., chemical mechanical polishing (CMP). During planarization process, the top of conductive layer 790 and second and second moulding layers 770, 7100 are planarized to form separated storage nodes 7110.

Figure 7G:
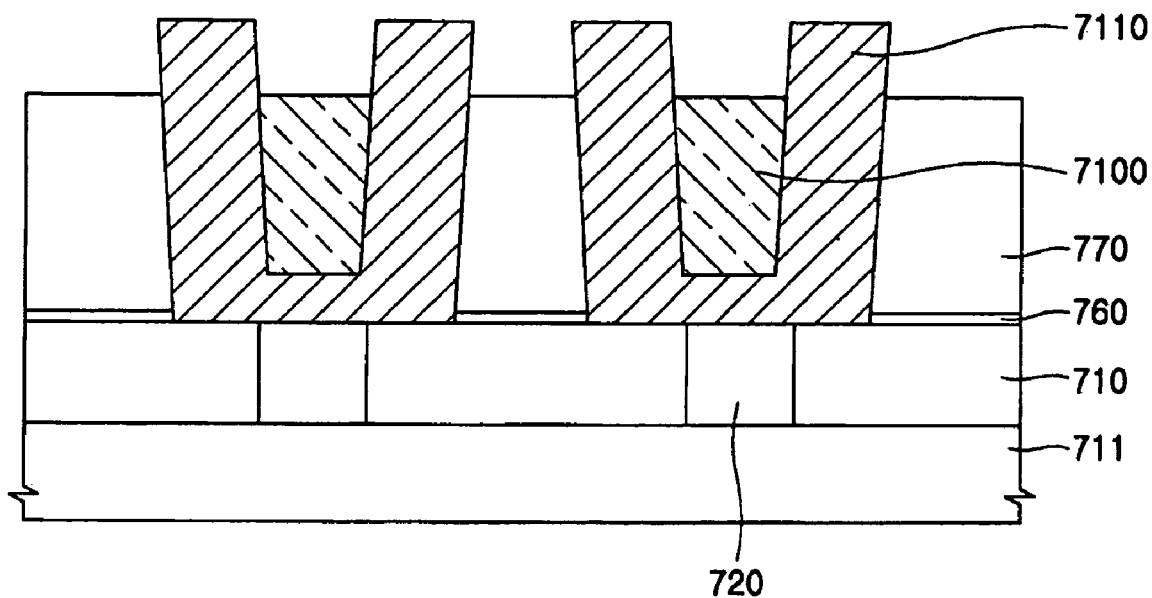

Referring to FIG. 7G, the planarized second and second moulding layers 770, 7100 are partially removed in a vertical direction using a PAA-based etchant, as described above. Thus, during this process, storage nodes 7110 are substantially left unetched.

Figure 7H:
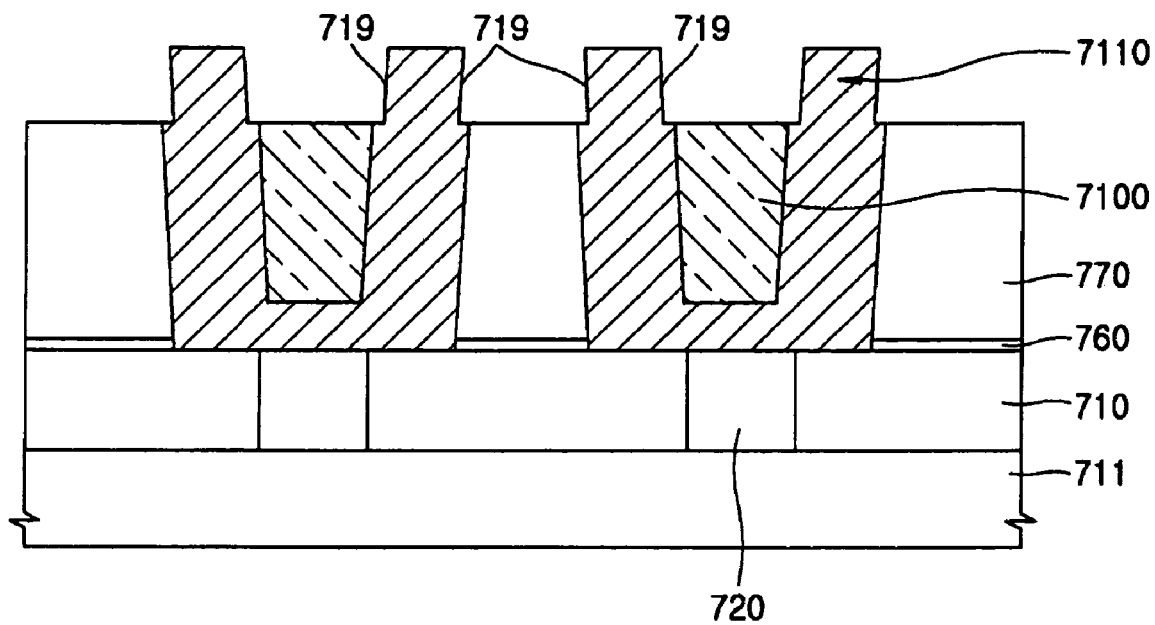

Referring to FIG. 7H, thinning of the exposed sidewall portion of storage node 7110 is illustrated. In other words, inner and outer sidewalls 717, 719 of partially exposed storage node 7110 are then partially etched in a horizontal direction. For example, inner and outer sidewalls 717, 719 of the partially exposed storage node 7110 are both etched to a width of, for example, approximately 40 Å. As in the vertical etching described above, the side walls of the partially exposed storage nodes 7110 can be partially etched through a chemical dry etching process. The chemical dry etching process may use a gas phase etchant such as CF4+O2. The temperature of substrate 711 may be approximately 0~60° C. The power may be approximately 100 W~600 W. The pressure may be approximately 10~50 Pa. The flow rate of CF4 may be approximately 30~80 sccm/sec. The flow rate of O2 may be approximately 150~300 sccm/sec.

Alternatively, side walls 717, 719 of partially exposed storage node 7110 may be partially etched in a horizontal direction through a wet etching process, e.g., step SC1 of the RCA wafer cleaning process that uses a 5:1:1 ratio of a H2O:H2O2: NH4OH solution for removal of insoluble organic contaminants.

Figure 7I:
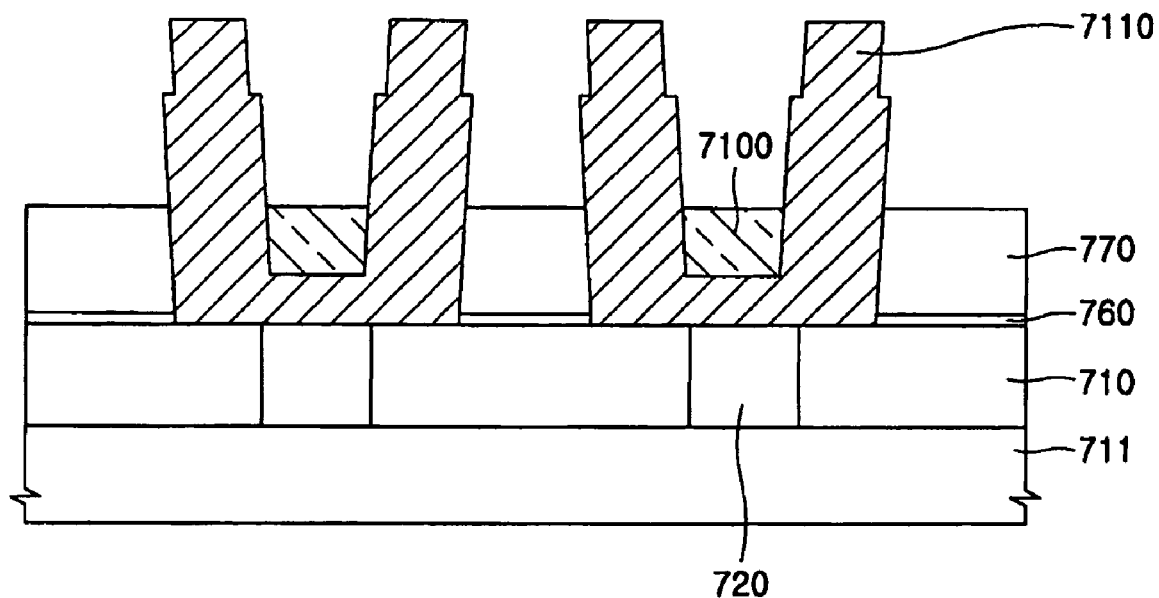

Referring to FIG. 7I, first moulding layer pattern 770 and second moulding layer 7100 are partially further removed again in a vertical direction. Again, a PAA-based etchant is used, which removes portions of first and second moulding layers 770 and 7100 without substantially etching storage node 7110.

Figure 7J:
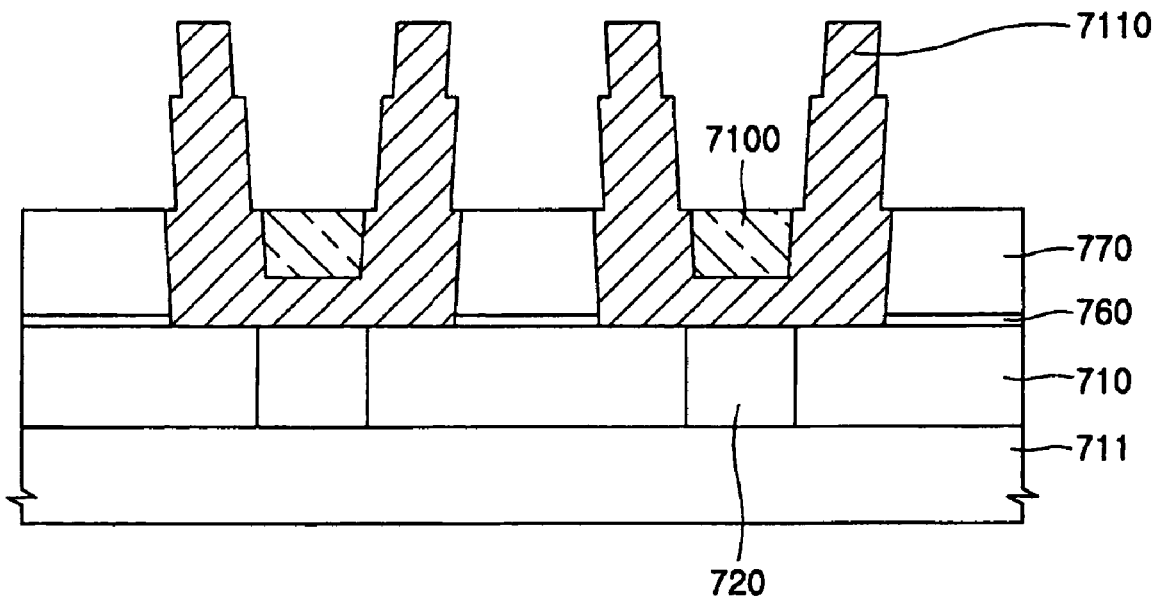

Referring to FIG. 7J, the inner and outer side walls of the partially exposed storage nodes 7110 are partially etched further again in a horizontal direction using a method similar to that described with reference to FIG. 7H.

The number of the above horizontal and vertical etching steps can be determined depending on the particular application. For example, more horizontal and vertical etchings can be added or even reduced. In this embodiment, the number of steps formed on sidewalls of storage nodes 7110 is determined by the number of the horizontal and vertical etching steps.

Figure 7K:
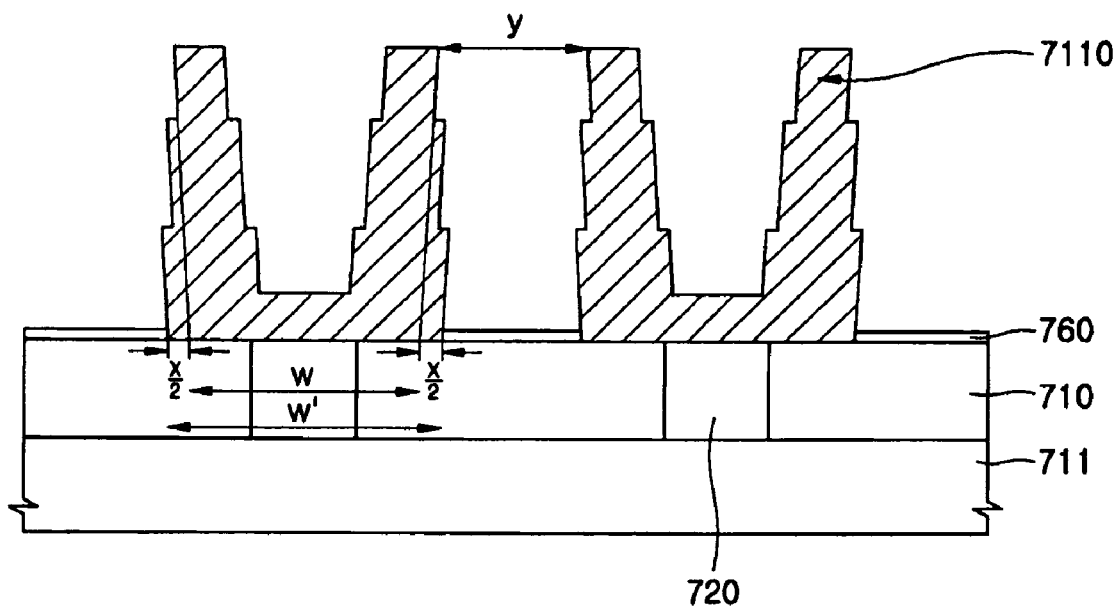

Referring to FIG. 7K, the remaining first moulding layer pattern 770 and second moulding layer 7100 are substantially completely removed using, again, a PAA-based etchant.

After removing insulating layers 770, 7100, a phosphine-annealing process may be performed to improve the surface characteristics of storage node 7110.

It should be noted that the width of the bottom portion of storage node 7110 can be increased by an amount "x", as indicated in FIG. 7K, as contrasted to the dotted lines which represent a corresponding Background Art capacitor structure. The amount x is can be in the range of about 10 nm to about 40 nm. The width of the bottom portion of the Background Art storage node is represented by the letter W, while W' indicates the width of the bottom portion of storage node 7110 according to the above-described embodiment of the present invention. Width W can be about 3200 Å and width W' can be about 4000 Å. Also, the angle between outer sidewalls 719 and the top surface of storage node 7110 may be closer to 90°, for example, 90±2° relative to the corresponding Background Art structure. Thus, the distance "y" between the adjacent storage nodes 7110 and the width of the bottom portion of the storage node can be substantially increased, as compared with the Background Ask capacitor structure. For this reason, the stability of the capacitor structure can be substantially increased, thereby decreasing the problems in the Background Art such as stiction or leaning of the corresponding storage nodes.

Figure 7L:
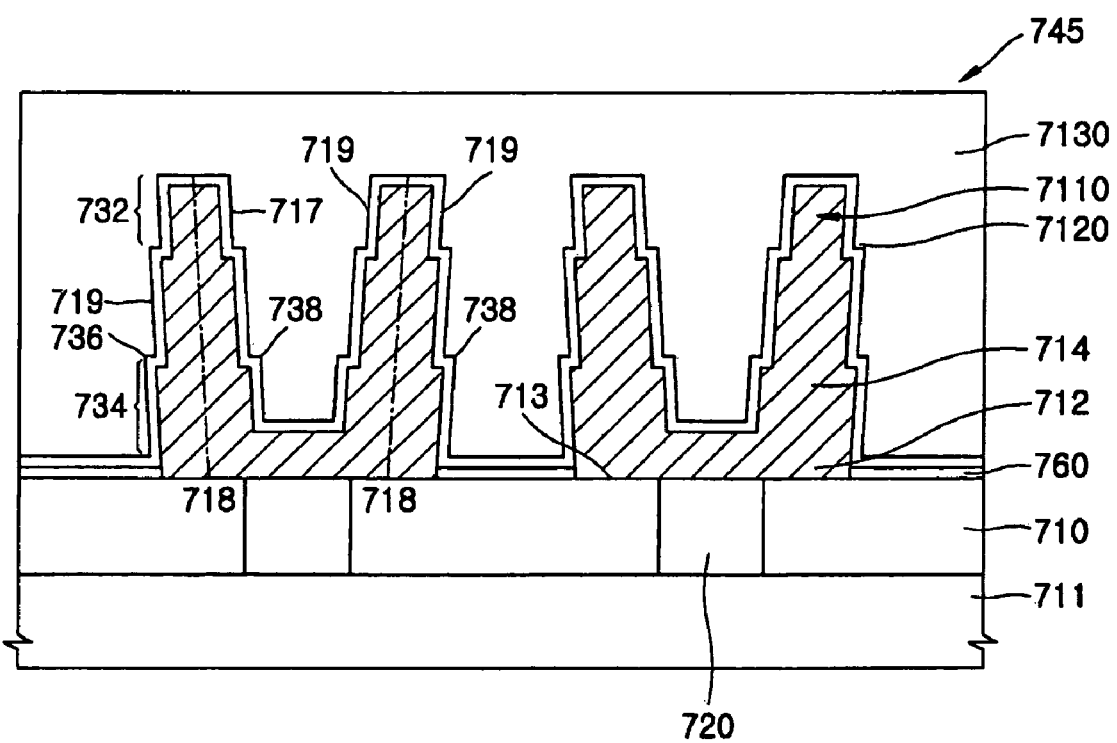

Referring to FIG. 7L, a capacitor dielectric layer 7120, e.g., using conventional dielectric material, is formed on the storage node (capacitor lower electrode) 7110. Then, a capacitor upper electrode 7130 is formed on dielectric layer 7120 to complete a capacitor 740. Upper electrode 7130 may be formed of a material that includes a doped polysilicon, a metal such as W, Pt, Ru, and Ir, a conductive metal nitride such as TiN, TaN, and WN, and a conductive metal oxide such as $RuO_2$ and $IrO_2$, and any combination thereof. Also, upper electrode 714 and capacitor lower electrode 712 may be formed of different materials.

Accordingly, capacitor 740 fabricated by the processes described above comprises a storage node 7110 having a base 712 (or a bottom portion). Capacitor 740 further includes a tapered wall 714 formed on base 712.

Wall 714 has an upper portion 32 and a lower portion 34. The width of upper portion 32 is at least 200 Å and the width of lower portion is at least 400 Å. Thus, lower portion 34 can have a greater width than upper portion 32. The lower portion may be a portion of wall 714 immediately below upper portion 32 or the upper portion may be a portion of wall 714 immediately above lower portion 34.

Although it is not illustrated in the drawings, corners of the top end portion of storage node 7110 can be rounded off to prevent a device failure.

According to at least one embodiment of the present invention, wall 714 can be viewed as having an inner sidewall 717 and an outer sidewall 719. Wall 714 may be seen to have a midline 18, which is a center line connecting the mid points between upper and inner sidewalls 717, 719. Midline 18 is a virtual line drawn to enhance discussion of the illustration. Inner sidewall 717 and outer sidewall 719 are substantially symmetrical with each other in relation to midline 18.

According to at least one embodiment of the present invention, wall 714 may be stepwise tapered. In particular, wall 714 has a first step 38 formed on inner sidewall 717 and a second step 36 formed on outer sidewall 719. First and second steps 36, 38 may be substantially symmetrical in relation to midline 18.

According to at least one embodiment of the present invention, outer sidewall 719 of wall 714 forms an approximately 790 degree angle with respect to plane 13 of base 712 or top surface of storage node 7110, thus increasing the distance between storage nodes 7110. Outer sidewall 719 of the wall 714, however, may have a slightly positive slope with respect to the plane of base.

Figure 8:
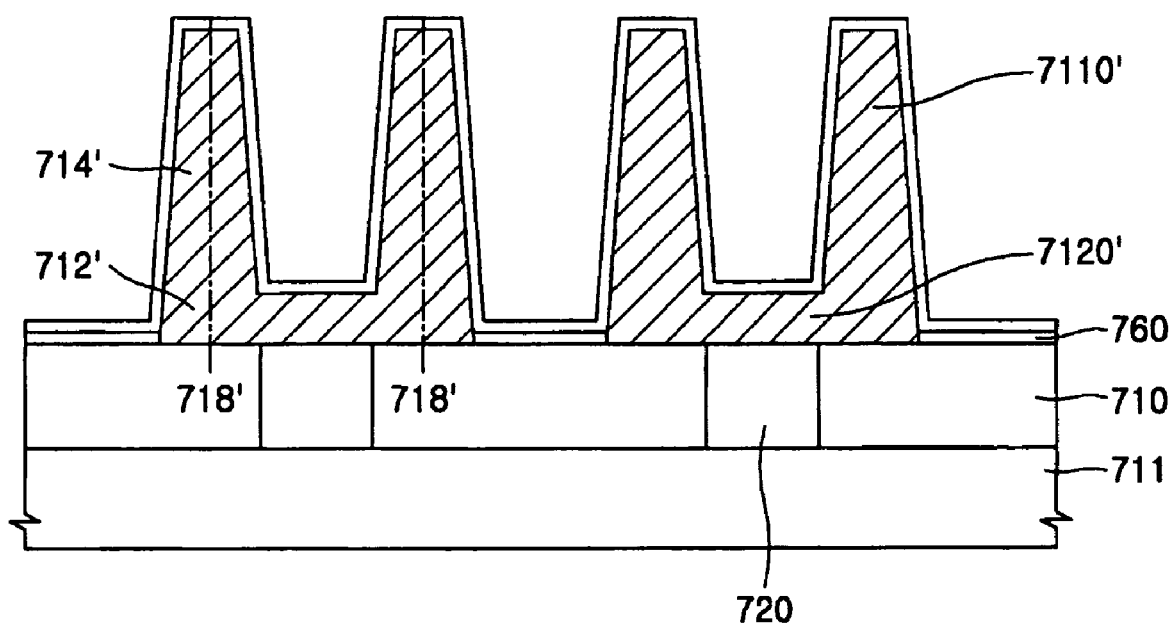
Figure 9:
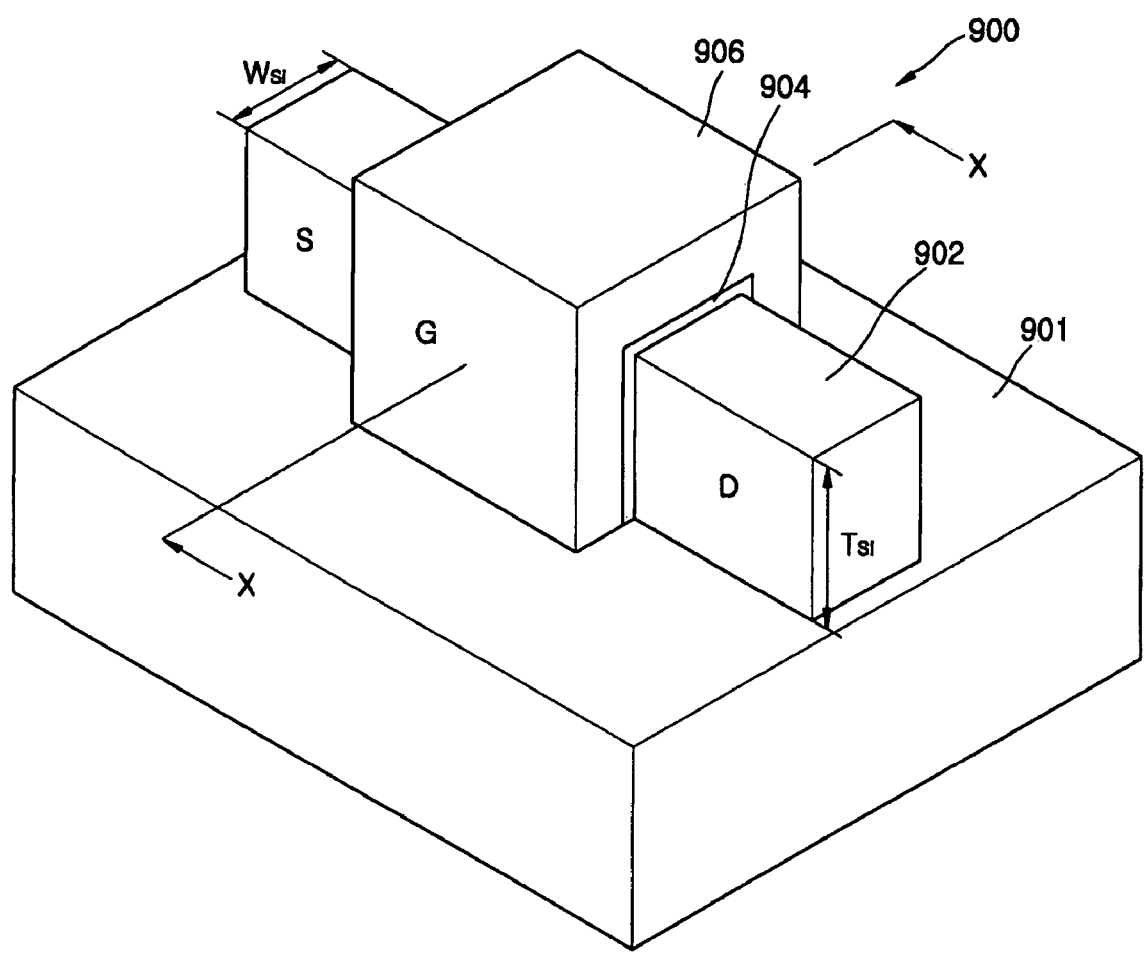
FIG. 9 is a three-quarter perspective view of the smaller footprint architecture according to the Background Art, which is generally referred to as a FinFET and particularly here as a triple-channel FinFET.
Figure 10:
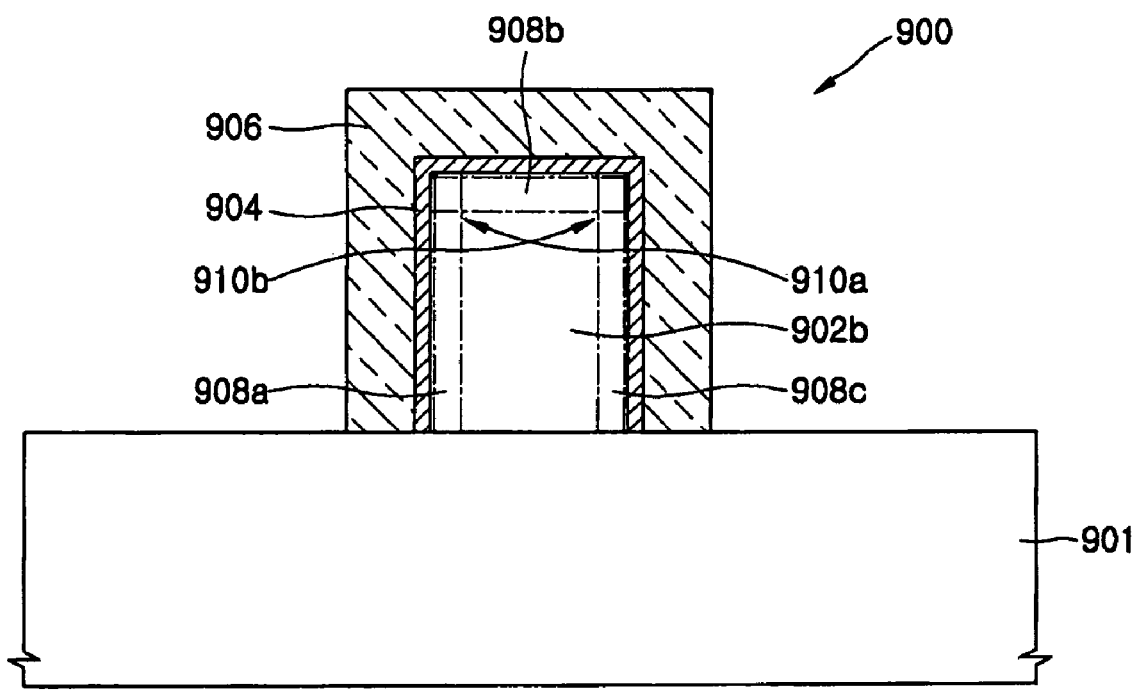
FIG. 10 is a cross-sectional view of Background Art triple-channel FinFET 700 taken along line X-X' of FIG. 9.

FIG. 8 is a cross-sectional view of a capacitor lower (or, in other words, storage) electrode of a semiconductor device according to at least one other embodiment of the present invention.

Referring to FIG. 8, wall 714' may be tapered gradually without a step. In other words, the width of storage node 7110' is gradually reduced from the bottom to the top of wall 714'. Although the process illustrated in FIGS. 7A-7L are particularly directed to forming a wall that is stepwise tapered, one skilled in the art will understand how to form the wall that is tapered gradually without a step. For example, the structure shown in FIG. 8 can be formed using an etchant that can perform both the vertical and horizontal etching concurrently. The etch selectivity ratio can be chosen to perform both the horizontal and vertical etching processes.

In either embodiment, base 712 and wall 714 can form a storage node of one cylinder stack (OCS) capacitor. The storage node or wall 714 may be substantially square, circle, or oval in shape when viewed in plan view.

Of course, although several variances and example embodiments of the present invention are discussed herein, it is readily understood by those of ordinary skill in the art that various additional modifications may also be made to the present invention. Accordingly, the example embodiments discussed herein are not limiting of the present invention.

What is claimed:

1. A method of manufacturing a semiconductor device having a multi-bridge-channel field effect transistor (MB-CFET) structure, comprising:
    providing a structure having stacked Si bridge layers and SiGe interbridge layers, respectively, and supported by at least one bridge-support structure; and
    applying an etchant composition to side surfaces of the SiGe bridge layers, the etchant including peracetic acid (PAA), and a fluorinated acid,
    wherein a relative amount of PAA in the composition is sufficient to yield an etch rate ratio of SiGe:Si for NMOS transistors of the MBCFET device that is substantially the same as an etch rate ratio of SiGe:Si for PMOS transistors of the MBCFET device.

2. A method of selectively removing SiGe from between layers of silicon, comprising:
    providing a substrate;
    forming a stack of alternating layers of SiGe and Si on the substrate;
    exposing side surfaces of the stack; and
    applying an etchant composition to side surfaces of the SiGe bridge layer, the etchant including peracetic acid (PAA) and a fluorinated acid,
    wherein a relative amount of PAA in the composition is sufficient to yield an etch rate ratio of SiGe:Si for NMOS transistors that is substantially the same as an etch rate ratio of SiGe:Si for PMOS transistors.

3. A method of manufacturing a semiconductor capacitor, comprising:
    providing a substrate that includes a conductive region;
    forming a SiGe layer on the substrate;
    forming a storage node hole in the SiGe layer to expose the conductive region in the substrate;
    forming a silicon layer on the SiGe layer and on the exposed conductive region of the substrate;
    forming an insulating layer on the silicon layer;
    selectively removing portions of the silicon layer and the insulating layer to define a storage electrode; and
    applying an etchant composition to side surfaces of the SiGe layer, the etchant including peracetic acid (PAA) and a fluorinated acid.

4. A method of manufacturing an integrated circuit CMOS field effect transistor, comprising:
    forming a pre-active pattern on a surface of a substrate, the pre-active pattern including a series of SiGe interbridge layers and Si bridge layers stacked alternately upon each other;
    forming source/drain regions on the substrate, at opposite ends of the pre-active pattern;
    selectively removing the plurality of interbridge layers using an etchant to form a plurality of tunnels passing through the pre-active pattern to define an active channel pattern including the tunnels and a plurality of bridges including the bridge layers, wherein the etchant exhibits an etch rate ratio of SiGe:Si for NMOS transistors of a CMOS device that is substantially the same as an etch rate ratio of SiGe:Si for PMOS transistors of the CMOS device; and
    forming a gate electrode in the tunnels and surrounding the bridges.

5. The method of claim 4, wherein forming source/drain regions includes etching spaced apart regions of the pre-active pattern and forming source/drain regions in the etched regions.

6. The method of claim 5, wherein etching spaced apart regions of the pre-active pattern includes etching spaced apart regions of the pre-active pattern to define first and second opposite sides of the pre-active pattern;
    forming source/drain regions includes forming a respective one of the source/drain regions at a respective one of the first and second opposite sides;
    selectively removing includes selectively removing the plurality of interbridge layers to form a plurality of tunnels that pass through the pre-active pattern from third to fourth sides thereof; and
    forming a gate electrode includes forming a gate electrode that extends through the tunnels and surrounds the plurality of bridges on the third and fourth sides.

7. The method of claim 4, wherein the forming a pre-active pattern includes forming a pre-active pattern that includes three bridge layers and two interbridge layers, a respective one of which is between respective adjacent ones of the three bridge layers.

8. The method of claim 4, wherein the forming a gate electrode includes forming a gate electrode to fill up the tunnels and surround the bridges.

9. The method of claim 4, wherein the forming a pre-active pattern includes:
    forming a layer pattern on the substrate to define a multiple bridge region; and
    performing selective epitaxial growth to stack the interbridge layers and the bridge layers alternately on each other on the substrate surface in the multiple bridge region.

10. The method of claim 9, further comprising implanting ions into the substrate in the multiple bridge region, prior to forming the interbridge layers and the bridge layers.

11. The method of claim 5, wherein the etching includes:
    forming a dummy gate pattern defining a gate region on the pre-active pattern; and
    etching the pre-active pattern until the surface of the substrate is exposed using the dummy gate pattern as an etching mask.

12. The method of claim 11, further comprising:
    forming a mask layer on the source/drain regions, the substrate and the pre-active pattern;
    planarizing the mask layer until a surface of the dummy gate pattern is exposed, to thereby form a mask pattern exposing the dummy gate pattern;

removing the dummy gate pattern to form a gate trench using the mask pattern; and exposing sides of the pre-active pattern using the mask pattern, prior to selectively removing the plurality of interbridge layers.

13. The method of claim 5, wherein forming a pre-active pattern is preceded by implanting ions to form a doped portion of the substrate; and forming a pre-active pattern includes forming a pre-active pattern on the doped portion of the substrate.

14. The method of claim 13, wherein the spaced apart regions of the pre-active pattern are etched to below a projected range of the ion-implantation.

15. The method of claim 4, further comprising performing a channel ion implantation on the pre-active pattern prior to the selectively removing the plurality of interbridge layers.

16. The method of claim 15, wherein the channel ion implantation is performed such that each of the bridge layers has a different doping concentration from each other.

17. The method of claim 4, further comprising forming a gate-insulating layer on a surface of the bridges to surround the bridges prior to the forming a gate electrode.

18. The method of claim 17, further comprising performing a heat treatment in hydrogen or argon ambient prior to forming the gate-insulating layer.

19. The method of claim 4, wherein the interbridge layers of the pre-active pattern are formed such that an interbridge layer closest to the surface is thicker than remaining interbridge layers.

20. A method for forming an electrode of a capacitor for a semiconductor device, comprising:

forming an interlayer insulating layer on a semiconductor substrate, the interlayer insulating layer having a conductive pad therein;

forming an etch stop layer on the interlayer insulating layer;

forming a first moulding layer of SiGe on the etch stop layer;

forming a storage node opening in the first moulding layer;

depositing a conductive layer of Si on the first moulding layer and on the sidewalls and the bottom of the opening;

forming a second moulding layer of SiGe on the conductive layer;

planarizing the resulting structure until the top surface of the first moulding layer is exposed;

partially removing an upper portion of the first and second moulding layers using a PAA-based etchant to expose a sidewall portion of the conductive layer;

thinning the exposed sidewall portion; and removing the remaining portion of the first and second moulding layers.

21. The method of claim 20, wherein partially removing an upper portion and thinning the exposed sidewall portion are repeated one or more times.

22. The method of claim 20, wherein the thinning includes wet etching.

23. The method of claim 22, wherein the wet etching includes using SC1.

24. The method of claim 20, wherein the thinning includes currently etching the wall on both sides thereof.

25. The method of claim 20, wherein the thinning includes forming a first and second step on an inner and outer side sidewall of the wall, respectively, wherein the first and second steps are substantially symmetrical.

26. The method of claim 20, further comprising forming a dielectric layer over the conductive layer; and forming an upper electrode on the dielectric layer.

* * * * *